US009196629B2

(12) United States Patent
Sakuma et al.

(10) Patent No.: US 9,196,629 B2
(45) Date of Patent: Nov. 24, 2015

(54) NON-VOLATILE SEMICONDUCTOR MEMORY DEVICE HAVING CARBON DOPED COLUMNAR SEMICONDUCTOR LAYER

(71) Applicant: Kabushiki Kaisha Toshiba, Minato-ku (JP)

(72) Inventors: Haruka Sakuma, Yokkaichi (JP); Shuichi Toriyama, Yokohama (JP); Masumi Saitoh, Yokkaichi (JP); Yoshiaki Fukuzumi, Yokkaichi (JP); Naoki Yasuda, Mie (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/491,385

(22) Filed: Sep. 19, 2014

(65) Prior Publication Data

US 2015/0102399 A1 Apr. 16, 2015

(30) Foreign Application Priority Data

Oct. 15, 2013 (JP) ................................ 2013-215066

(51) Int. Cl.

*H01L 27/115* (2006.01)
*H01L 29/66* (2006.01)
*H01L 29/792* (2006.01)

(52) U.S. Cl.

CPC .... *H01L 27/11582* (2013.01); *H01L 29/66833* (2013.01); *H01L 29/7926* (2013.01)

(58) Field of Classification Search

CPC ............ H01L 27/115; H01L 27/11558; H01L 27/11582; H01L 27/11563; H01L 21/8234

USPC .......................................................... 257/324

See application file for complete search history.

(56) References Cited

U.S. PATENT DOCUMENTS

| | | | | |
|---|---|---|---|---|
| 8,334,561 | B2 | 12/2012 | Fukuzumi et al. | |
| 8,372,720 | B2 | 2/2013 | Fukuzumi et al. | |
| 8,410,538 | B2 | 4/2013 | Ishiduki et al. | |
| 2006/0043457 | A1 * | 3/2006 | Baik | 257/314 |
| 2008/0153226 | A1 * | 6/2008 | Mokhlesi | 438/259 |
| 2009/0090960 | A1 * | 4/2009 | Izumi et al. | 257/324 |
| 2009/0173981 | A1 * | 7/2009 | Nitta | 257/302 |
| 2010/0020608 | A1 * | 1/2010 | Kamigaichi et al. | 365/185.05 |

(Continued)

FOREIGN PATENT DOCUMENTS

| | | | |
|---|---|---|---|
| JP | 2009-146954 | A | 7/2009 |
| JP | 2010-199312 | A | 9/2010 |

(Continued)

*Primary Examiner* — Nathan Ha

(74) *Attorney, Agent, or Firm* — Oblon, McClelland, Maier & Neustadt, L.L.P.

(57) ABSTRACT

A memory string includes: a first semiconductor layer formed in a columnar shape extending in a stacking direction perpendicular to a substrate; a tunnel insulating film formed surrounding a side surface of the first semiconductor layer; a charge accumulation film formed surrounding the tunnel insulating film and configured to be capable of accumulating charges; a block insulating film formed surrounding the charge accumulation film; and a plurality of first conductive layers formed surrounding the block insulating film and disposed at a predetermined interval in the stacking direction. The first semiconductor layer comprises carbon-doped silicon and being formed to have different carbon concentrations in upper and lower portions in the stacking direction.

13 Claims, 21 Drawing Sheets

(56) References Cited

U.S. PATENT DOCUMENTS

| | | | | |
|---|---|---|---|---|
| 2010/0207195 | A1* | 8/2010 | Fukuzumi et al. | 257/326 |
| 2010/0320528 | A1* | 12/2010 | Jeong et al. | 257/324 |
| 2011/0057249 | A1* | 3/2011 | Nakao et al. | 257/324 |
| 2012/0181602 | A1 | 7/2012 | Fukuzumi et al. | |
| 2013/0270621 | A1 | 10/2013 | Mori | |
| 2014/0061773 | A1* | 3/2014 | Higuchi et al. | 257/326 |

FOREIGN PATENT DOCUMENTS

| | | | |
|---|---|---|---|
| JP | 2011-60991 | A | 3/2011 |
| JP | 2011-198806 | A | 10/2011 |
| JP | 2011-199194 | A | 10/2011 |
| JP | 2012-146861 | A | 8/2012 |
| JP | 2013-222785 | A | 10/2013 |

* cited by examiner

NON-VOLATILE SEMICONDUCTOR MEMORY DEVICE HAVING CARBON DOPED COLUMNAR SEMICONDUCTOR LAYER

This application is based on and claims the benefit of priority from prior Japanese Patent Application No. 2013-215066, filed on Oct. 15, 2013, the entire contents of which are incorporated herein by reference.

FIELD

The embodiments described below relate to anon-volatile semiconductor memory device.

BACKGROUND

In recent years, for more integrated memory cells, a number of semiconductor memory devices (stacked non-volatile semiconductor memory devices) including three-dimensionally arranged memory cells have been proposed. As the non-volatile semiconductor memory devices become more integrated, it is required to stably hold data of the memory cells even if the memory cell size becomes miniaturized.

DETAILED DESCRIPTION

Figure 1:
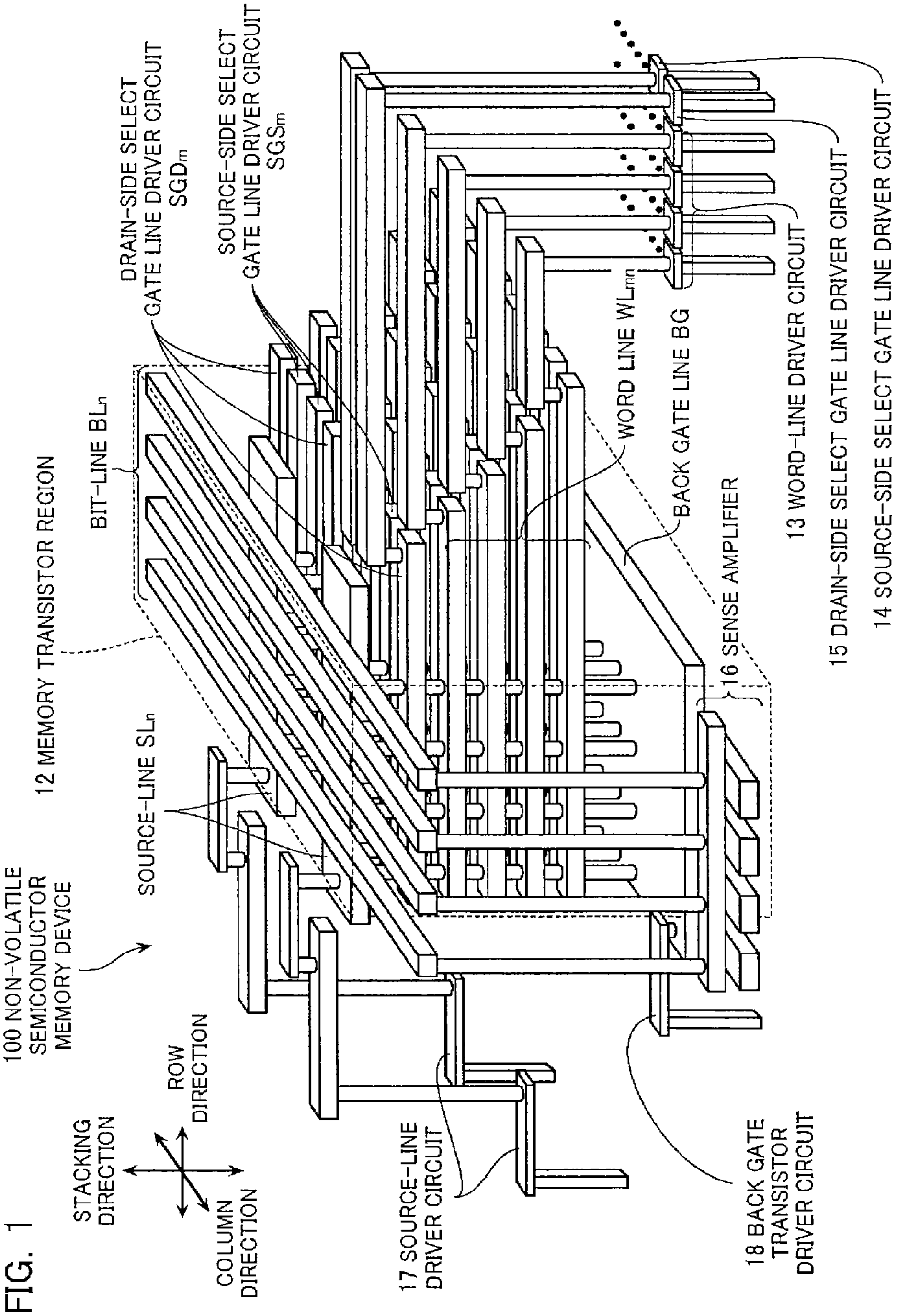
FIG. 1 is a schematic configuration diagram of a non-volatile semiconductor memory device according to a first embodiment.

A non-volatile semiconductor memory device according to one embodiment comprises a memory string, the memory string including a plurality of electrically rewritable memory transistors connected in series. The memory string comprises: a first semiconductor layer formed in a columnar shape extending in a stacking direction perpendicular to a substrate; a tunnel insulating film formed surrounding aside surface of the first semiconductor layer; a charge accumulation film formed surrounding the tunnel insulating film and configured to be capable of accumulating charges; a block insulating film formed surrounding the charge accumulation film; and a plurality of first conductive layers formed surrounding the block insulating film and disposed at a predetermined interval in the stacking direction. The first semiconductor layer comprises carbon-doped silicon and is formed to have different carbon concentrations in upper and lower portions in the stacking direction.

Referring now to the drawings, non-volatile semiconductor memory devices according to embodiments will be described.

First Embodiment

Configuration of Non-Volatile Semiconductor Memory Device 100 According to First Embodiment FIG. 1 is a schematic diagram of a non-volatile semiconductor memory device 100 according to a first embodiment. With reference to FIG. 1, the non-volatile semiconductor memory device 100 according to the first embodiment mainly comprises a memory transistor region 12, a word-line driver circuit 13, a source-side select gate line ($SGS_m$) driver circuit 14, a drain-side select gate line ($SGD_m$) driver circuit 15, a sense amplifier 16, a source-line driver circuit 17, and aback gate transistor driver circuit 18. The memory transistor region 12 comprises a memory transistor for storing data. The word-line driver circuit 13 controls the voltage applied to word-lines $WL_{mn}$. The source-side select gate line ($SGS_m$) driver circuit 14 controls the voltage applied to the source-side select gate line $SGS_m$. The drain-side select gate line ($SGD_m$) driver circuit 15 controls the voltage applied to the drain-side select gate line ($SGD_m$). The sense amplifier 16 amplifies the potential read from the memory transistor. The source-line driver circuit 17 controls the voltage applied to a source-line $SL_n$. The back gate transistor driver circuit 18 controls the voltage applied to a back gate line BG. Note that in addition to the above, the non-volatile semiconductor memory device 100 according to the first embodiment comprises a bit-line driver circuit (not shown) for controlling the voltage applied to bit-lines $BL_n$.

Figure 2:
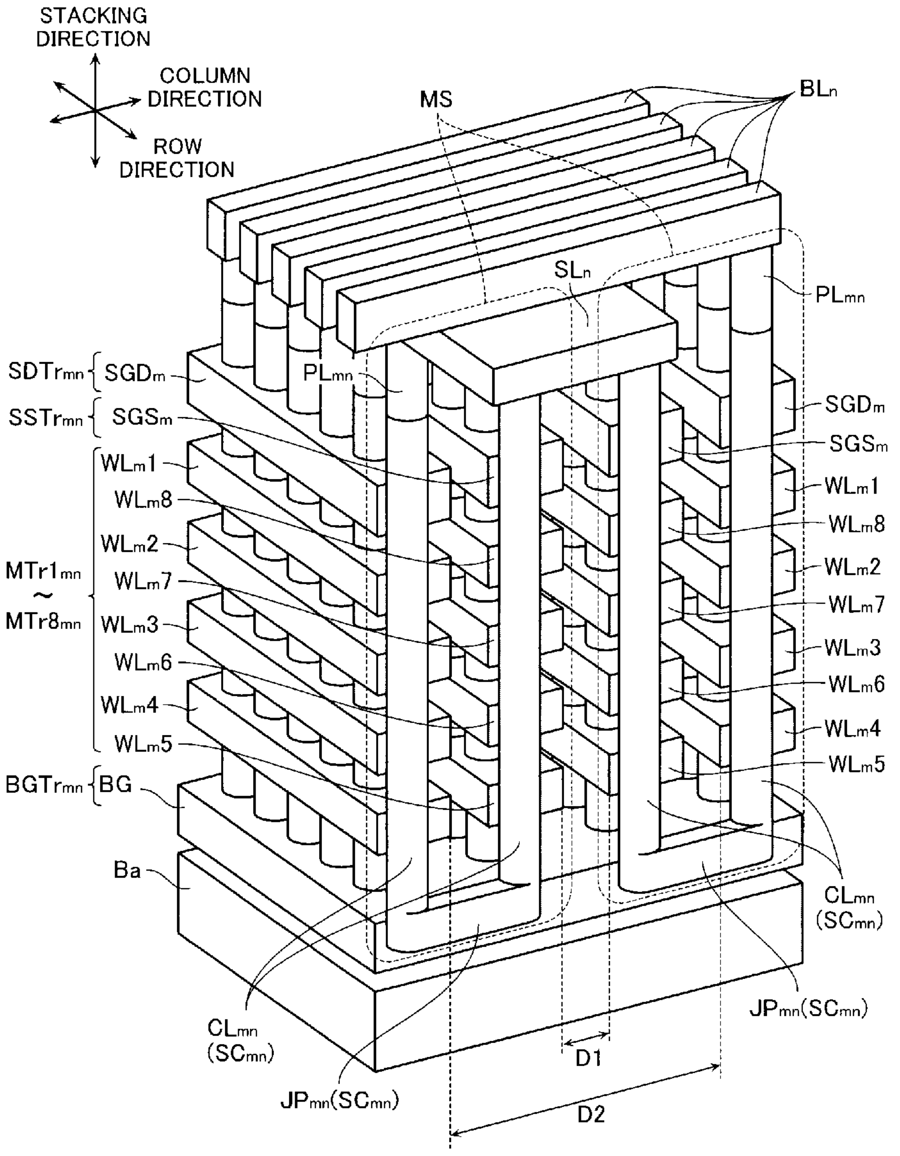
FIG. 2 is a partial schematic perspective view of the memory transistor region according to the first embodiment.
Figure 3:
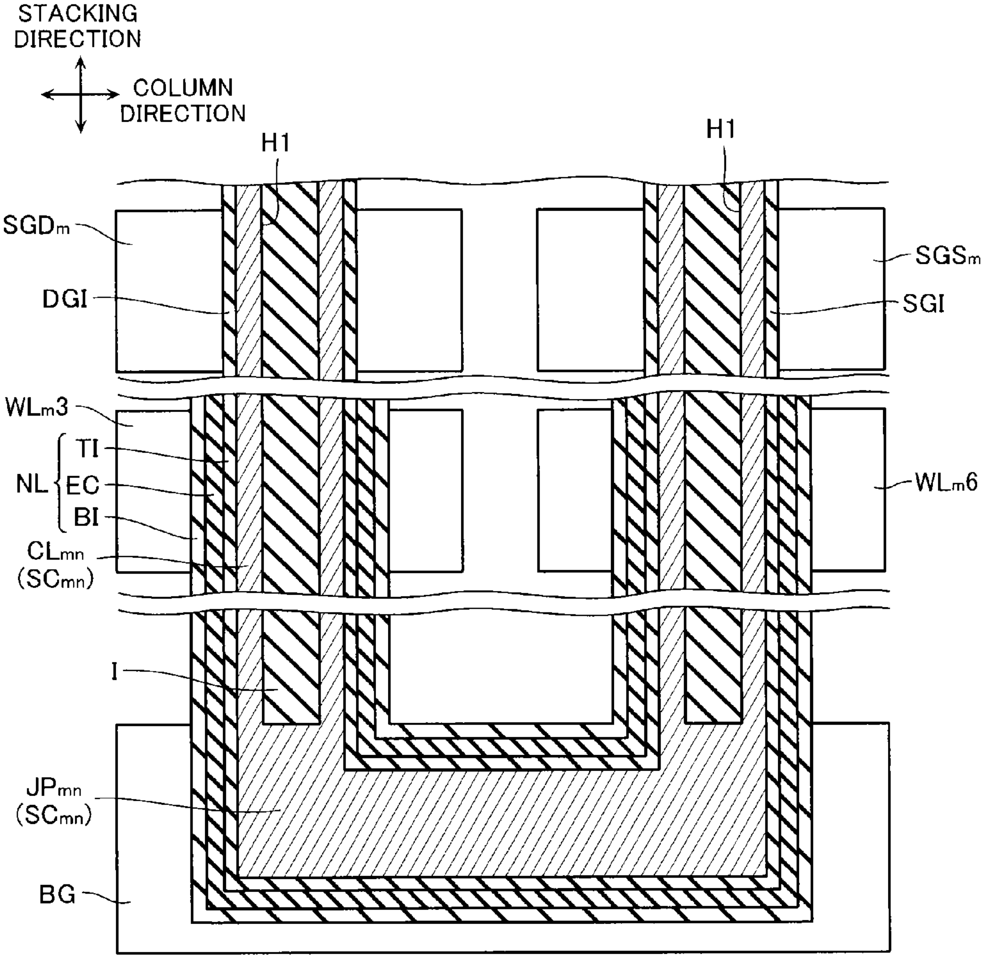
FIG. 3 is an enlarged view of one memory string according to the first embodiment.

FIG. 2 is a partially schematic perspective view of the memory transistor region 12 of the non-volatile semiconductor memory device 100 according to the first embodiment. In the first embodiment, the memory transistor region 12 comprises m<mul>n (m and n are natural numbers) memory strings MS. Each memory string MS comprises memory transistors ($MTr1_{mn}$ to $MTr8_{mn}$), a source-side select transistor $SSTr_{mn}$, and a drain-side select transistor $SDTr_{mn}$. FIG. 2 shows an example of m=6 and n=2. FIG. 3 is a partially enlarged cross-sectional view of FIG. 2.

In the non-volatile semiconductor memory device 100 according to the first embodiment, the memory transistor region 12 comprises a plurality of memory strings MS. As described below in more detail, each memory string MS comprises a plurality of electrically rewritable memory transistors $MTr_{mn}$ connected in series.

Each memory string MS comprises a U-shaped semiconductor $SC_{mn}$. The U-shaped semiconductor $SC_{mn}$ is connected to the word-lines $WL_{mn}$ ($WL_m1$ to $WL_m8$), the source-side select gate line $SGS_m$, the drain-side select gate line $SGD_m$, and the back gate line BG.

Each U-shaped semiconductor $SC_{mn}$ is formed in a U-shape when viewed in the row direction. Each U-shaped semiconductor $SC_{mn}$ comprises a pair of columnar portions $CL_{mn}$ extending in a direction generally perpendicular to the semiconductor substrate Ba, and a coupling portion $JP_{mn}$ formed coupling the lower edges of the pair of columnar portions $CL_{mn}$. In addition, with reference to FIG. 3, each U-shaped semiconductor $SC_{mn}$ comprises a hole portion H1 inside each columnar portion $CL_{mn}$. The hole portion H1 comprises an insulating portion I embedded therein. Note that each columnar portion $CL_{mn}$ may be a cylindrical shape or a prismatic shape. In addition, each columnar portion $CL_{mn}$ may be a columnar shape having a stepped shape. Here, the row direction is a direction perpendicular to the stacking direction and the column direction described below is a direction perpendicular to the vertical and row directions.

Each U-shaped semiconductor $SC_{mn}$ is disposed so that a straight line joining the central axes of the pair of columnar portions $CL_{mn}$ is parallel with the column direction. Also, a plurality of U-shaped semiconductors $SC_{mn}$ are disposed in a matrix in a plane comprising the row and column directions.

Each word-line $WL_{mn}$ in each layer has a shape extending in parallel with the row direction. The word-lines $WL_{mn}$ in each layer are insulated to each other and formed in repeated lines in the column direction at a first interval.

The memory transistors ($MTr1_{mn}$ to $MTr8_{mn}$) provided at the same position in the column direction and arranged in the row direction have gates connected to the same word-line $WL_{mn}$. With reference to FIG. 1, the word-lines $WL_{mn}$ have end portions in the row direction formed in a stepped shape.

With reference to FIG. 3, between the word-lines $WL_{mn}$ and the columnar portion $CL_{mn}$, an ONO (Oxide-Nitride-Oxide) layer NL is formed. The ONO layer NL comprises a tunnel insulating layer TI in contact with the columnar portion $CL_{mn}$, a charge accumulation layer EC in contact with the tunnel insulating layer TI, and a block insulating layer BI in contact with the charge accumulation layer EC. The charge accumulation layer EC has a function of accumulating charges.

In other words, in the above configuration, each columnar portion $CL_{mn}$ of the U-shaped semiconductor $SC_{mn}$ serves as the bodies of the memory transistors $MTr_{mn}$. The charge accumulation layer EC is formed surrounding the side surface of the columnar portion $CL_{mn}$ in the U-shaped semiconductor $SC_{mn}$. In addition, each word-line $WL_{mn}$ is formed surrounding the side surface of the columnar portion $CL_{mn}$ and the charge accumulation layer EC. In addition, each word-line $WL_{mn}$ is divided for each columnar portion $CL_{mn}$ adjacent in the column direction.

The drain-side select gate line $SGD_m$ is provided above the top word-line $WL_{mn}$. The drain-side select gate line $SGD_m$ has a shape extending in parallel with the row direction. The drain-side select gate lines $SGD_m$ are insulated to each other and formed in repeated lines in the column direction at first and second intervals D1 and D2 (D2>D1) alternately. The drain-side select gate lines $SGD_m$ formed at the second interval D2 have therebetween the source-side select gate lines $SGS_m$ described below. In addition, the columnar portion $CL_{mn}$ is formed passing through the column-direction center of the drain-side select gate line $SGD_m$. With reference to FIG. 3, between the drain-side select gate line $SGD_m$ and the columnar portion $CL_{mn}$, a gate insulating layer DGI is formed.

The source-side select gate line $SGS_m$ is provided above the top word-line $WL_{mn}$. The source-side select gate line $SGS_m$ has a shape extending in parallel with the row direction. The source-side select gate lines $SGS_m$ are insulated to each other and formed in repeated lines in the column direction at the first and second intervals D1 and D2 alternately. The source-side select gate lines $SGS_m$ formed at the second interval D2 have therebetween the drain-side select gate line $SGD_m$. In addition, the columnar portion $CL_{mn}$ is formed passing through the column-direction center of the source-side select gate line $SGS_m$. With reference to FIG. 3, between the source-side select gate line $SGS_m$ and the columnar portion $CL_{mn}$, a gate insulating layer SGI is formed.

In other words, in the above configuration, a set of two drain-side select gate lines $SGD_m$ and a set of source-side select gate lines $SGS_m$ are formed alternately in the column direction at the first interval D1. In addition, each drain-side select gate line $SGD_m$ and each source-side select gate line $SGS_m$ are formed surrounding the columnar portion $CL_{mn}$ and the gate insulating layers SGI and DGI, respectively. In addition, each drain-side select gate line $SGD_m$ and each source-side select gate line $SGS_m$ are divided for each columnar portion $CL_{mn}$ adjacent in the column direction.

The back gate line BG is formed spreading two-dimensionally in the row and column directions to cover the portion below a plurality of coupling portions $JP_{mn}$. With reference to FIG. 3, between the back gate line BG and the coupling portions $JP_{mn}$, the above ONO layer NL is formed.

In addition, the columnar portions $CL_{mn}$ of the U-shaped semiconductor $SC_{mn}$ adjacent in the column direction have the source-line $SL_n$ formed on their upper edges.

In addition, the columnar portions $CL_{mn}$ extending beyond the drain-side select gate lines $SGD_m$ have the bit-lines $BL_n$ formed on their upper edges via the plug lines $PL_{mn}$. Each bit-line $BL_n$ is formed in a position above the source-line $SL_n$. The bit-lines $BL_n$ are formed in repeated lines in the row direction at a predetermined interval, each line extending in the column direction.

Figure 4:
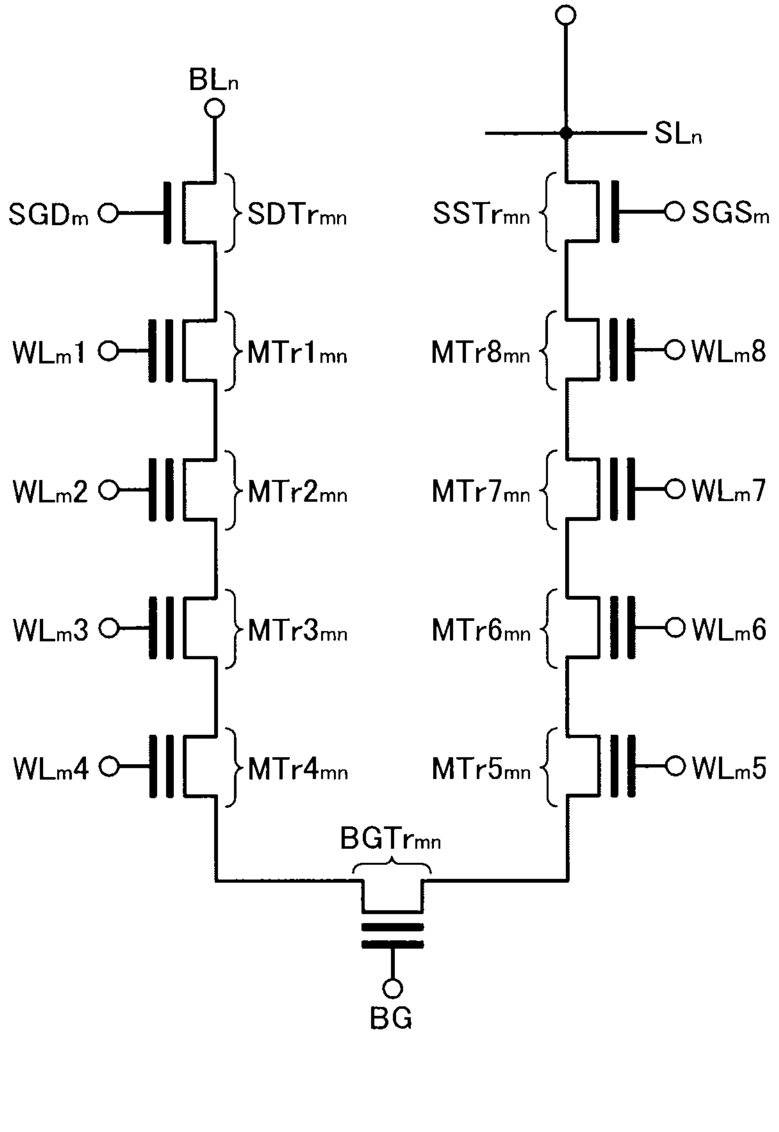
FIG. 4 is a circuit diagram of one memory string according to the first embodiment.

With reference next to FIG. 2 to FIG. 4, circuitry comprising the memory strings MS in the first embodiment will be described. FIG. 4 is a circuit diagram of one memory string MS in the first embodiment.

With reference to FIG. 2 to FIG. 4, in the first embodiment, each memory string MS comprises eight memory transistors MTr1$_{mn}$ to MTr8$_{mn}$, the source-side select transistor $SSTr_{mn}$, the drain-side select transistor $SDTr_{mn}$, and the back gate transistor $BGTr_{mn}$. These eight memory transistors MTr1$_{mn}$ to MTr8$_{mn}$ as well as the source-side select transistor $SSTr_{mn}$ and the drain-side select transistor $SDTr_{mn}$ are connected in series (see FIG. 4).

Each memory transistor $MTr_{mn}$ comprises the columnar portion $CL_{mn}$, the ONO layer NL (charge accumulation layer EC), and the word-line $WL_{mn}$. The end portion of the word-line $WL_{mn}$ that is adjacent to the ONO layer NL functions as the control gate electrode of the memory transistor $MTr_{mn}$.

The drain-side select transistor $SDTr_{mn}$ comprises the columnar portion $CL_{mn}$, the gate insulating layer DGI, and the drain-side select gate line $SGD_m$. The end portion of the drain-side select gate line $SGD_m$ that is adjacent to the gate insulating layer DGI functions as the control gate electrode of the drain-side select transistor $SDTr_{mn}$.

The source-side select transistor $SSTr_{mn}$ comprises the columnar portion $CL_{mn}$, the gate insulating layer SGI, and the source-side select gate line $SGS_m$. The end portion of the source-side select gate line $SGS_m$ that is adjacent to the gate insulating layer SGI functions as the control gate electrode of the source-side select transistor $SSTr_{mn}$.

The back gate transistor $BGTr_{mn}$ comprises the coupling portion $JP_{mn}$, the ONO layer NL (charge accumulation layer EC), and the back gate line BG. The end portion of the back gate line BG that is adjacent to the ONO layer NL functions as the control gate electrode of the back gate transistor $BGTr_{mn}$.

(Specific Configuration of Non-Volatile Semiconductor Memory Device 100 According to First Embodiment)

Figure 5A:
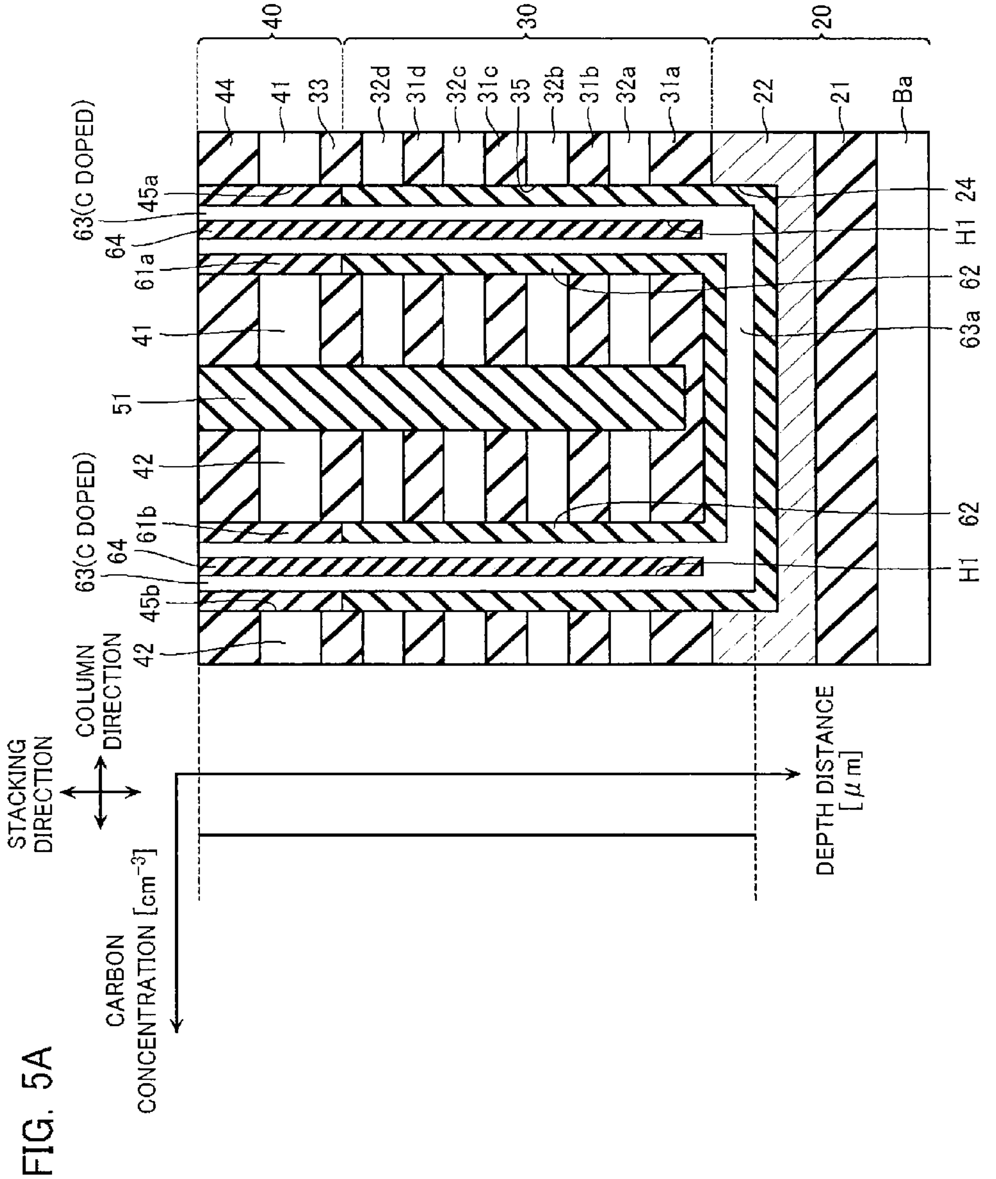
FIG. 5A is a cross-sectional view of the memory transistor region according to the first embodiment.

Then, with reference to FIG. 5A, a specific configuration of the non-volatile semiconductor memory device 100 according to the first embodiment will be described. FIG. 5A is a cross-sectional view of the memory transistor region 12 of the non-volatile semiconductor memory device 100 according to the first embodiment. In addition, FIG. 5A shows a cross-section in the column direction.

With reference to FIG. 5A, the configuration of the memory transistor region 12 of the non-volatile semiconductor memory device 100 according to the first embodiment will be described. With reference to FIG. 5A, the memory transistor region 12 (memory string MS) comprises, sequentially in the stacking direction from the semiconductor substrate Ba, aback gate transistor layer 20, a memory transistor layer 30, and a select transistor layer 40. The back gate transistor layer 20 functions as the above-described back gate transistor $BGTr_{mn}$. The memory transistor layer 30 functions as the above memory transistor $MTr_{mn}$. The select transistor layer 40 functions as the above-described source-side select transistor layer $SSTr_{mn}$ and the drain-side select transistor $SDTr_{mn}$.

The back gate transistor layer 20 comprises the semiconductor substrate Ba, and a back gate insulating layer 21 and a back gate conductive layer 22, which are sequentially stacked on the semiconductor substrate Ba. The back gate insulating layer 21 and the back gate conductive layer 22 are formed spreading in the row and column directions to the end portion of the memory transistor region 12. The back gate conductive layer 22 is formed covering the lower and side surfaces of a coupling portion 63*a* of the U-shaped semiconductor layer 63 as described below. The back gate conductive layer 22 is also formed to the same height as the upper surface of the coupling portion 63*a*.

The back gate insulating layer 21 comprises, for example, silicon dioxide ($SiO_2$). Preferably, the back gate insulating layer 21 comprises a material having a permittivity similar to the relative permittivity 3.9 of silicon dioxide layer. For example, the back gate insulating layer 21 may comprise a silicon dioxide layer formed with tetraethoxysilane (TEOS) or with polysilazane-based solvent fired by a thermal treatment.

The back gate conductive layer 22 comprises, for example, polysilicon (p-Si). The back gate conductive layer 22 comprises one of metal silicide layers such as a conductive polysilicon layer and a nickel silicide (NiSi) layer. For example, the back gate conductive layer 22 may comprise a metal compound such as tantalum nitride (TaN), tantalum carbide (TaC), or titanium nitride (TiN), or a material having metallic electrical conduction properties such as Ni, V, Cr, Mn, Y, Mo, Ru, Rh, Hf, Ta, W, Ir, Co, Ti, Er, Pt, Pd, Zr, Gd, Dy, Ho, or Er, or silicide thereof.

In addition, the back gate transistor layer 20 comprises a back gate hole 24 formed digging the back gate conductive layer 22. The back gate hole 24 comprises an opening having the lateral direction in the row direction and the longitudinal direction in the column direction. A plurality of back gate holes 24 are formed in the row and column directions at a predetermined interval. In other words, the back gate holes 24 are formed in a matrix in a plane comprising the row and column directions.

The memory transistor layer 30 comprises, above the back gate conductive layer 22, an alternating stack of first to fourth inter-word-line insulating layers 31*a* to 31*d* and first to fourth word-line conductive layers 32*a* to 32*d*. In addition, the memory transistor layer 30 comprises a memory protection insulating layer 33 deposited on the fourth word-line conductive layer 32*d*.

The first to fourth inter-word-line insulating layers 31*a* to 31*d* and the first to fourth word-line conductive layers 32*a* to 32*d* are formed extending in the row direction and formed in repeated lines in the column direction at a predetermined interval. The first to fourth inter-word-line insulating layers 31*a* to 31*d* and the first to fourth word-line conductive layers 32*a* to 32*d* are manufactured in a stepped shape at the end portions in the row direction (not shown).

The first to fourth inter-word-line insulating layers 31*a* to 31*d* comprise, for example, silicon dioxide ($SiO_2$). Preferably, the first to fourth inter-word-line insulating layers 31*a* to 31*d* comprise a material having a permittivity similar to the relative permittivity 3.9 of silicon dioxide layer. For example, the first to fourth inter-word-line insulating layers 31*a* to 31*d* may comprise a silicon dioxide layer formed with tetraethoxysilane (TEOS) or with polysilazane-based solvent fired by a thermal treatment.

The first to fourth word-line conductive layers 32*a* to 32*d* comprise, for example, polysilicon (p-Si). In addition, the first to fourth word-line conductive layers 32*a* to 32*d* comprise one of metal silicide layers such as a conductive polysilicon layer and a nickel silicide (NiSi) layer. For example, the first to fourth word-line conductive layers 32*a* to 32*d* may comprise a metal compound such as tantalum nitride (TaN), tantalum carbide (TaC), or titanium nitride (TiN), or a material having metallic electrical conduction properties such as Ni, V, Cr, Mn, Y, Mo, Ru, Rh, Hf, Ta, W, Ir, Co, Ti, Er, Pt, Pd, Zr, Gd, Dy, Ho, or Er, or silicide thereof. The memory protection insulating layer 33 comprises, for example, silicon nitride (SiN).

In addition, the memory transistor layer 30 comprises a memory hole 35 formed passing through the first to fourth inter-word-line insulating layers 31*a* to 31*d* and the first to fourth word-line conductive layers 32*a* to 32*d*. The memory hole 35 is formed in alignment with the positions near the column-direction ends of each back gate hole 24.

The select transistor layer 40 comprises a source-side conductive layer 41 and a drain-side conductive layer 42 that are deposited on the memory protection insulating layer 33. The source-side conductive layer 41 and the drain-side conductive layer 42 are formed extending in the row direction and formed in repeated lines in the column direction at a predetermined interval.

A plurality of drain-side conductive layers 42 are formed in the column direction at the first and second intervals D1 and D2 alternately (see FIG. 2). Likewise, a plurality of source-side conductive layers 41 are formed in the column direction at the first and second intervals D1 and D2 alternately. Between the drain-side conductive layers 42 formed in the column direction at the second interval D2, two source-side conductive layers 41 formed at the first interval D1 are formed. In addition, between the source-side conductive layers 41 formed in the column direction at the second interval D2, two drain-side conductive layers 42 formed at the first interval D1 are formed.

In addition, the select transistor layer 40 comprises a select transistor insulating layer 44 formed on the drain-side and source-side conductive layers 42 and 41. The select transistor layer 40 and the memory transistor layer 30 comprise a separation insulating layer 51. The separation insulating layer 51 is provided to pass through and separate the drain-side conductive layer 42, the source-side conductive layer 41, the first to fourth inter-word-line insulating layers 31*a* to 31*d*, and the first to fourth word-line conductive layers 32*a* to 32*d*.

The drain-side conductive layer 42 and source-side conductive layer 41 comprise, for example, polysilicon (p-Si). The drain-side conductive layer 42 and the source-side conductive layer 41 comprise one of metal silicide layers such as a conductive polysilicon layer and a nickel silicide (NiSi) layer. For example, the drain-side conductive layer 42 and the source-side conductive layer 41 may comprise a metal compound such as tantalum nitride (TaN), tantalum carbide (TaC), or titanium nitride (TiN), or a material having metallic electrical conduction properties such as Ni, V, Cr, Mn, Y, Mo, Ru, Rh, Hf, Ta, W, Ir, Co, Ti, Er, Pt, Pd, Zr, Gd, Dy, Ho, or Er, or silicide thereof.

The select transistor insulating layer 44 comprises, for example, silicon dioxide ($SiO_2$). Preferably, the select transistor insulating layer 44 comprises a material having a permittivity similar to the relative permittivity 3.9 of silicon dioxide layer. For example, the select transistor insulating layer 44 may comprise a silicon dioxide layer formed with tetraethoxysilane (TEOS) or with polysilazane-based solvent fired by a thermal treatment.

In addition, the select transistor layer 40 comprises a drain-side hole 45*b* formed passing through the select transistor insulating layer 44 and the drain-side conductive layer 42. In addition, the select transistor layer 40 comprises a source-side hole 45*a* formed passing through the select transistor insulating layer 44 and the source-side conductive layer 41. The drain-side and source-side holes 45*b* and 45*a* are formed in positions aligned with the memory hole 35.

In the above configuration, a side wall of the source-side hole 45*a* has a source-side gate insulating layer 61*a* formed thereon. In addition, a side wall of the drain-side hole 45*b* has a drain-side gate insulating layer 61*b* formed thereon. The source-side gate insulating layer 61*a* and drain-side gate insulating layer 61*b* comprise silicon dioxide ($SiO_2$). In this embodiment, the source-side and drain-side gate insulating layers 61*a* and 61*b* comprise a gate-insulating film of a single layer $SiO_2$ (of about 1.5 to 6 nm) that is formed discontinuously from a memory gate insulating layer 62 as described below. The source-side and drain-side gate insulating layers 61*a* and 61*b* may comprise, however, a gate insulating layer of a MONOS film structure that is formed continuously with the memory gate insulating layer 62 included in the memory cell.

A side wall of the memory hole 35 and back gate hole 24 has a memory gate insulating layer 62 formed thereon. In addition, the U-shaped semiconductor layer 63 is formed in contact with the source-side gate insulating layer 61*a*, the drain-side gate insulating layer 61*b*, and the memory gate insulating layer 62. The U-shaped semiconductor layer 63 comprises a hole portion H1. In the hole portion of the U-shaped semiconductor layer 63, an inner insulating layer 64 is formed.

The drain-side gate insulating layer 61*b* and source-side gate insulating layer 61*a* have a cylindrical shape. The U-shaped semiconductor layer 63 has a U-shape when viewed in the row direction. The U-shaped semiconductor layer 63 comprises the coupling portion 63*a*. The coupling portion 63*a* is formed coupling the lower edges of the pair of columnar portions extending in a direction perpendicular to the semiconductor substrate Ba when viewed in the row direction. The inner insulating layer 64 comprises silicon dioxide ($SiO_2$) or silicon nitride (SiN).

The U-shaped semiconductor layer 63 functions as the above U-shaped semiconductor $SC_{mn}$. The back gate conductive layer 22 functions as the back gate line BG. In addition, the back gate conductive layer 22 functions as the control gate of the back gate transistor $BGTr_{mn}$. The first to fourth word-line conductive layers 32*a* to 32*d* function as the word-lines $WL_m$1 to $WL_m$8. In addition, the first to fourth word-line conductive layers 32*a* to 32*d* function as the control gates of the memory transistors $MTr_{mn}$. The drain-side conductive layer 42 functions as the drain-side select gate line $SGD_m$. In addition, the drain-side conductive layer 42 functions as the control gate of the drain-side select transistor $SDTr_{mn}$. The source-side conductive layer 41 functions as the source-side select gate line $SGS_m$. In addition, the source-side conductive layer 41 functions as the control gate of the source-side select transistor $SSTr_{mn}$. In addition, the inner insulating layer 64 corresponds to the insulating portion I in FIG. 3.

The memory gate insulating layer 62 comprises the block insulating layer BI, the charge accumulation layer EC, and the tunnel insulating layer TI. The memory gate insulating layer 62 comprises the ONO layer. Each of the block insulating layer BI, the charge accumulation layer EC, and the tunnel insulating layer TI included in the memory gate insulating layer 62 has a thickness of 1.5 to 12 nm.

The block insulating layer BI included in the memory gate insulating layer 62 has a function of reducing the leak current in the write/erase operation. The block insulating layer BI may comprise a material selected from the group of, for example, silicon dioxide ($SiO_2$), silicon oxynitride (SiON), aluminium oxide ($Al_2O_3$), aluminium oxynitride (AlON), hafnia ($HfO_2$), hafnium aluminate ($HfAlO_3$), nitride hafnia (HfON), nitrided hafnium aluminate (HfAlON), hafnium silicate (HfSiO), nitrided hafnium silicate (HfSiON), lanthanum oxide ($La_2O_3$), lanthanum aluminate ($LaAlO_3$), and lanthanum aluminum silicate (LaAlSiO).

The charge accumulation layer EC included in the memory gate insulating layer 62 may comprise a material selected from the group of, for example, silicon rich SiN, $Si_xN_y$ having any composition ratio x, y of silicon and nitrogen, silicon oxynitride (SiON), aluminium oxide ($Al_2O_3$), aluminium oxynitride (AlON), hafnia ($HfO_2$), hafnium aluminate ($HfAlO_3$), nitride hafnia (HfON), nitrided hafnium aluminate (HfAlON), hafnium silicate (HfSiO), nitrided hafnium silicate (HfSiON), lanthanum oxide ($La_2O_3$), and lanthanum aluminate ($LaAlO_3$). In addition, the charge accumulation layer EC may comprise silicon nanoparticles or a metal ion or the like.

The tunnel insulating layer TI included in the memory gate insulating layer 62 comprises, for example, a silicon dioxide ($SiO_2$) layer. The tunnel insulating layer TI may comprise silicon oxynitride or a stack structure of silicon dioxide and silicon nitride or the like. In addition, the tunnel insulating layer TI may comprise silicon nanoparticles or a metal ion or the like.

The U-shaped semiconductor layer 63 is formed continuously and integrally from the memory transistor layer to the select transistor layer 40. The U-shaped semiconductor layer 63 comprises polysilicon (p-Si). Here, in this embodiment, carbon (C) is doped in silicon at a predetermined ratio. Note that preferably, the carbon concentration in the U-shaped semiconductor layer 63 is about 1 to 20%, but it is not limited thereto. In this embodiment, the carbon concentration is constant in the U-shaped semiconductor layer 63 from the memory transistor layer 30 to the select transistor layer 40. The appropriate carbon concentration in the U-shaped semiconductor layer 63 may be set according to the degree of desired band-gap size (the conduction band rise or the valence band fall) or the like. If the U-shaped semiconductor layer 63 comprises a silicon carbide (SiC) crystal, the carbon (C) concentration in the U-shaped semiconductor layer 63 further increases, but the U-shaped semiconductor layer 63 comprising a silicon carbide (SiC) crystal requires increased operation voltage. Preferably, therefore, the U-shaped semiconductor layer 63 comprises carbon-doped silicon.

[Effects]

Figure 6A:
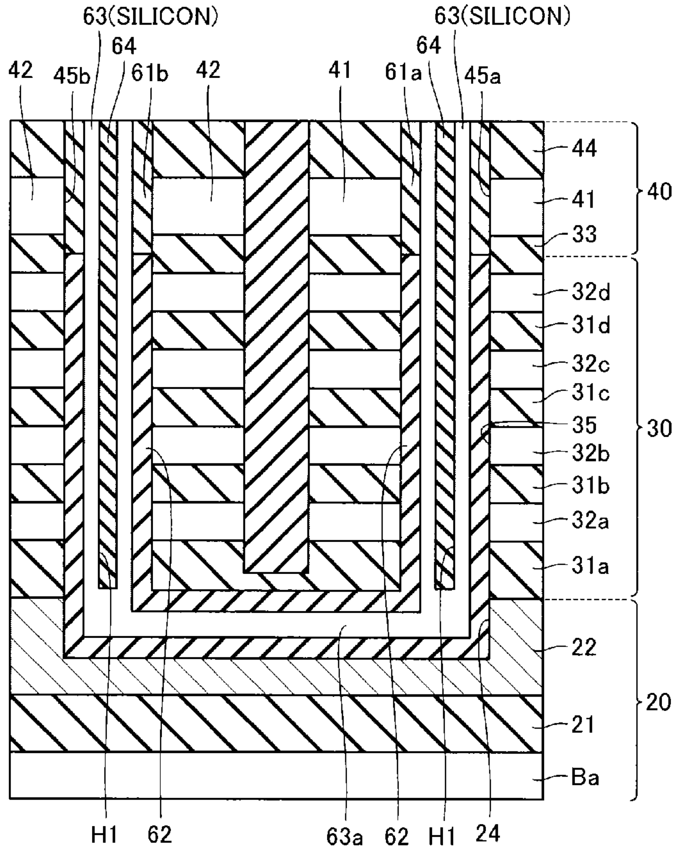
FIG. 6A is a cross-sectional view of a memory transistor region according to a comparative example.

Referring to a comparative example, the effects of the non-volatile semiconductor memory device according to this embodiment will be described. FIG. 6A illustrates a configuration of a non-volatile semiconductor memory device in the comparative example. The non-volatile semiconductor memory device in the comparative example is different from the non-volatile semiconductor memory device according to the first embodiment in that the U-shaped semiconductor layer 63 comprises carbon-undoped polysilicon. Other configurations of the non-volatile semiconductor memory device in the comparative example are similar to those of the non-volatile semiconductor memory device according to the first embodiment and thus their description is omitted here.

Figure 5B:
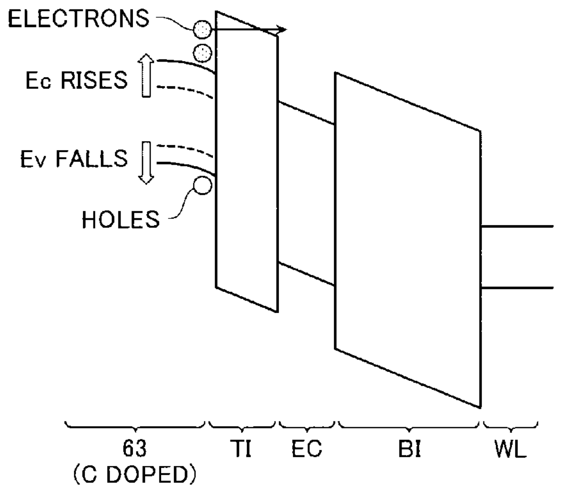
FIG. 5B illustrates a band gap of the memory transistor according to the first embodiment.
Figure 6B:
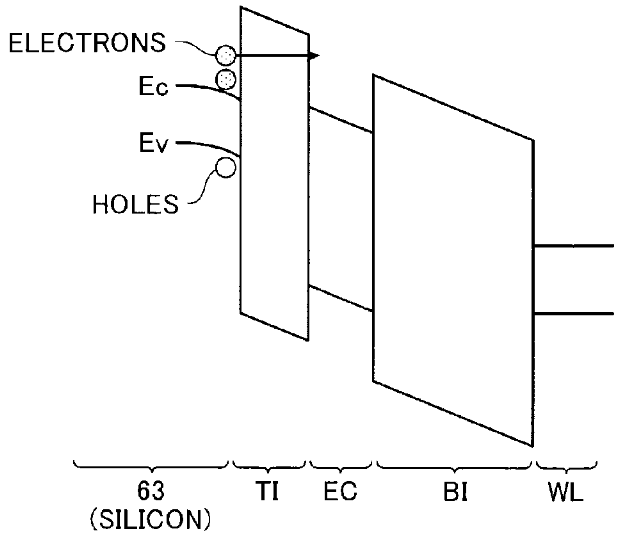
FIG. 6B illustrates a band gap of the memory transistor according to the comparative example.

FIG. 5B and FIG. 6B are band gap diagrams of the U-shaped semiconductor layer 63 according to this embodiment and the U-shaped semiconductor layer 63 in the comparative example, respectively. With reference to FIG. 5B and FIG. 6B, the U-shaped semiconductor layer 63 according to this embodiment comprises carbon-doped silicon. Therefore, compared to the U-shaped semiconductor layer 63 in the comparative example, the lower edge Ec of the conduction band rises and the upper edge Ev of the valence band falls. As a result, in the U-shaped semiconductor layer 63 according to this embodiment, the channel electron density is decreased in the U-shaped semiconductor layer 63 that functions as the channels of the memory transistors MTr. Decrease of the channel electron density in the U-shaped semiconductor layer 63 increases the threshold voltage of the memory transistors MTr. Therefore, even for voltage application during the read operation, the effect of the voltage may be reduced, thus stably holding data of the memory transistors MTr.

[Manufacturing Method]

A method of manufacturing the non-volatile semiconductor memory device according to this embodiment will be described. FIG. 7 to FIG. 14 illustrate manufacturing processes of the memory transistor region according to this embodiment.

Figure 7:
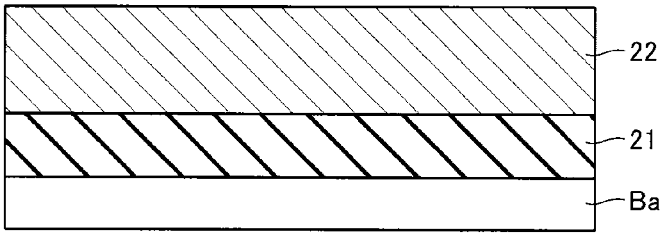
FIG. 7 illustrates a manufacturing process of the memory transistor region according to the first embodiment.

First, with reference to FIG. 7, silicon dioxide ($SiO_2$) and polysilicon (p-Si) are deposited on the semiconductor substrate Ba to form the back gate insulating layer 21 and the back gate conductive layer 22.

Figure 8:
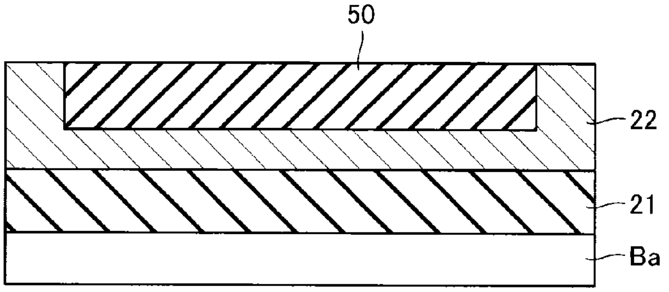
FIG. 8 illustrates a manufacturing process of the memory transistor region according to the first embodiment.

Then, with reference to FIG. 8, the lithography method and RIE (Reactive Ion Etching) methods are used to dig the back gate conductive layer 22 to form the back gate hole 24. Then, silicon nitride (SiN) is deposited filling in the back gate hole 24 to form the sacrificing layer 50.

Figure 9:
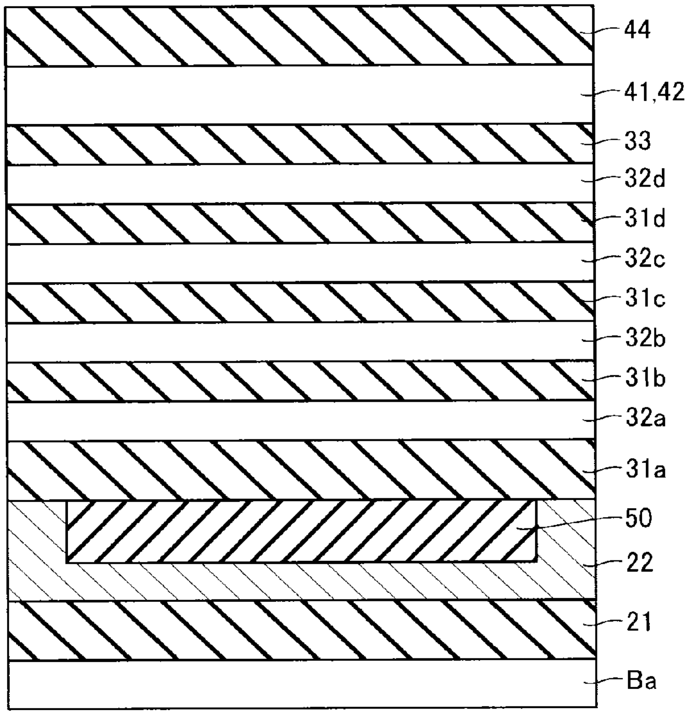
FIG. 9 illustrates a manufacturing process of the memory transistor region according to the first embodiment.

Then, with reference to FIG. 9, on the back gate conductive layer 22 and the sacrificing layer 50, silicon dioxide ($SiO_2$) and polysilicon (p-Si) are alternately deposited to form the first to fourth inter-word-line insulating layers 31*a* to 31*d* and the first to fourth word-line conductive layers 32*a* to 32*d*. Further, silicon dioxide ($SiO_2$) is deposited to form the memory protection insulating layer 33. On the memory protection insulating layer 33, polysilicon (p-Si) is deposited and manufactured with the lithography and RIE methods. Then, silicon dioxide ($SiO_2$) is deposited to form the source-side conductive layer 41, the drain-side conductive layer 42, and the select transistor insulating layer 44.

Figure 10:
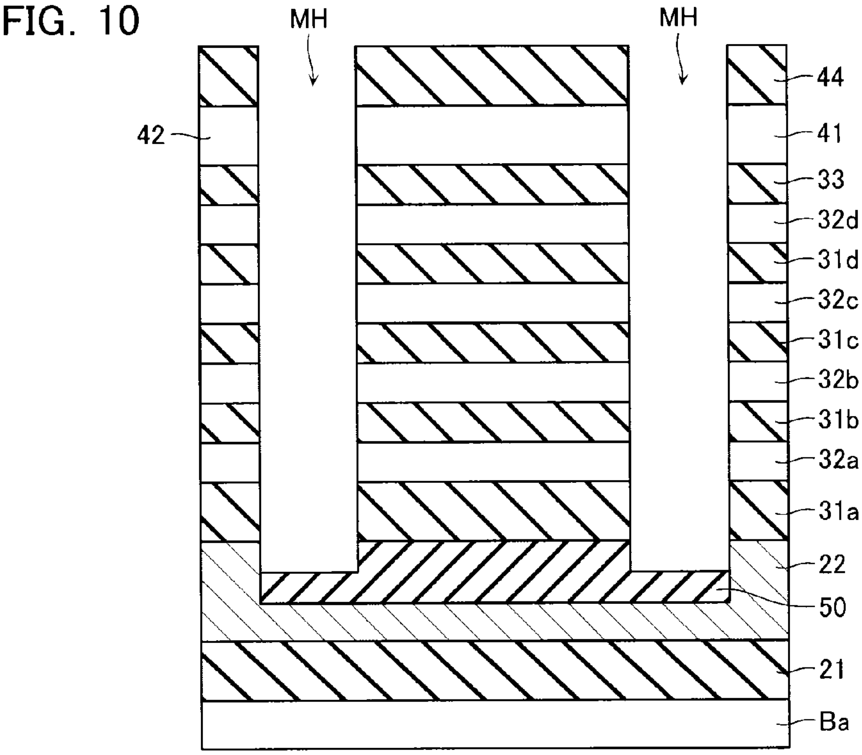
FIG. 10 illustrates a manufacturing process of the memory transistor region according to the first embodiment.

Then, with reference to FIG. 10, a memory hole MH is formed passing though the select transistor insulating layer 44, the source-side conductive layer 41, the drain-side conductive layer 42, the memory protection insulating layer 33, the first to fourth inter-word-line insulating layer 31*a* to 31*e*, and the first to fourth word-line conductive layers 32*a* to 32*d*. The memory hole MH is formed to arrive at the upper surfaces at the column direction ends of the sacrificing layer 50. The memory hole MH provides, after the steps described below, the memory hole 35 in the memory transistor layer 30 and the drain-side and source-side holes 45*b* and 45*a* in the select transistor layer 40.

Figure 11:
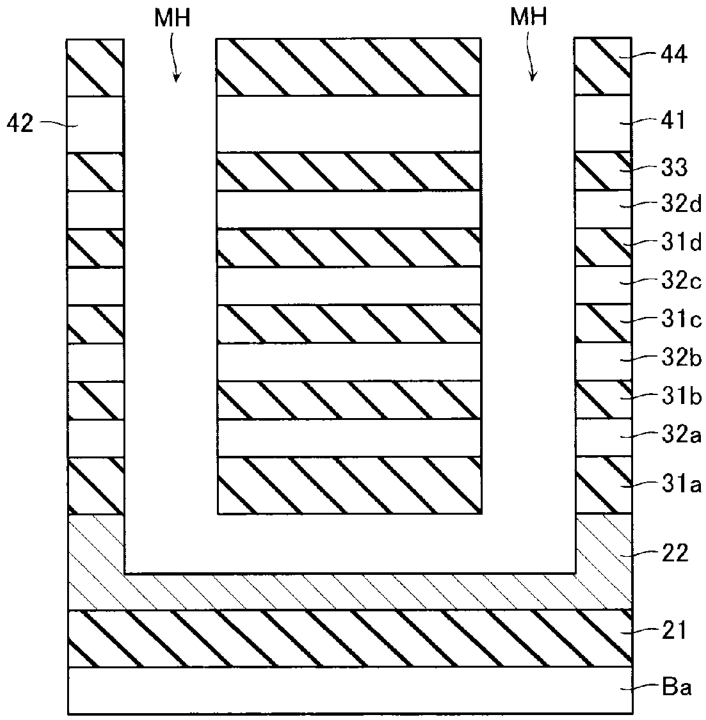
FIG. 11 illustrates a manufacturing process of the memory transistor region according to the first embodiment.

Then, with reference to FIG. 11, a hot phosphoric acid solution is used to remove the sacrificing layer 50.

Figure 12:
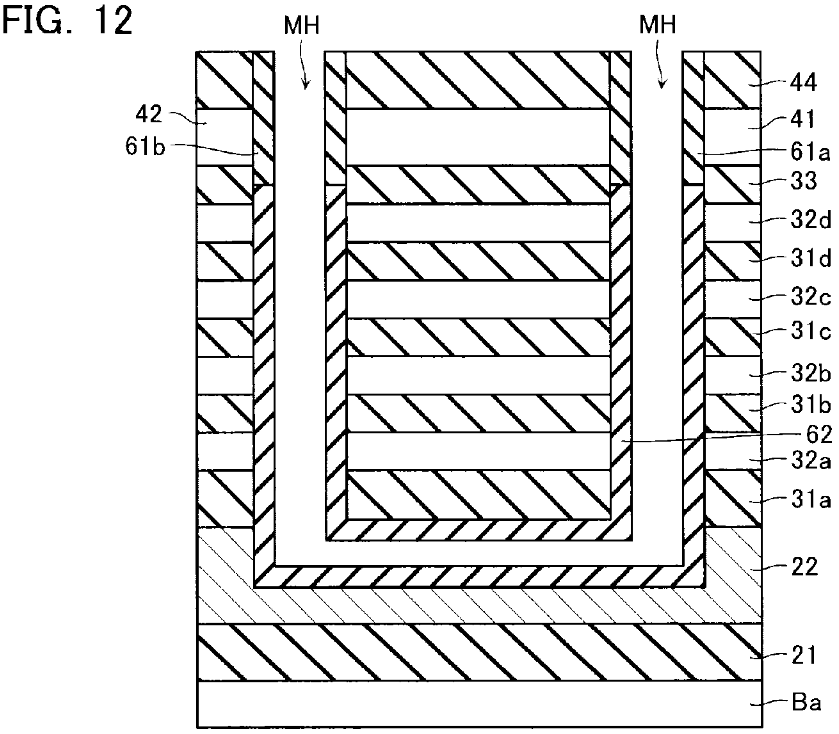
FIG. 12 illustrates a manufacturing process of the memory transistor region according to the first embodiment.

Then, with reference to FIG. 12, silicon dioxide ($SiO_2$), silicon nitride (SiN), and silicon dioxide ($SiO_2$) are deposited. By this step, the memory gate insulating layer 62 is formed. In addition, after this step, silicon dioxide ($SiO_2$) and silicon nitride (SiN) formed on the side surfaces of the source-side conductive layer 41 and the drain-side conductive layer 42 are removed to form the drain-side gate insulating layer 61*b* and the source-side gate insulating layer 61*a*.

Figure 13:
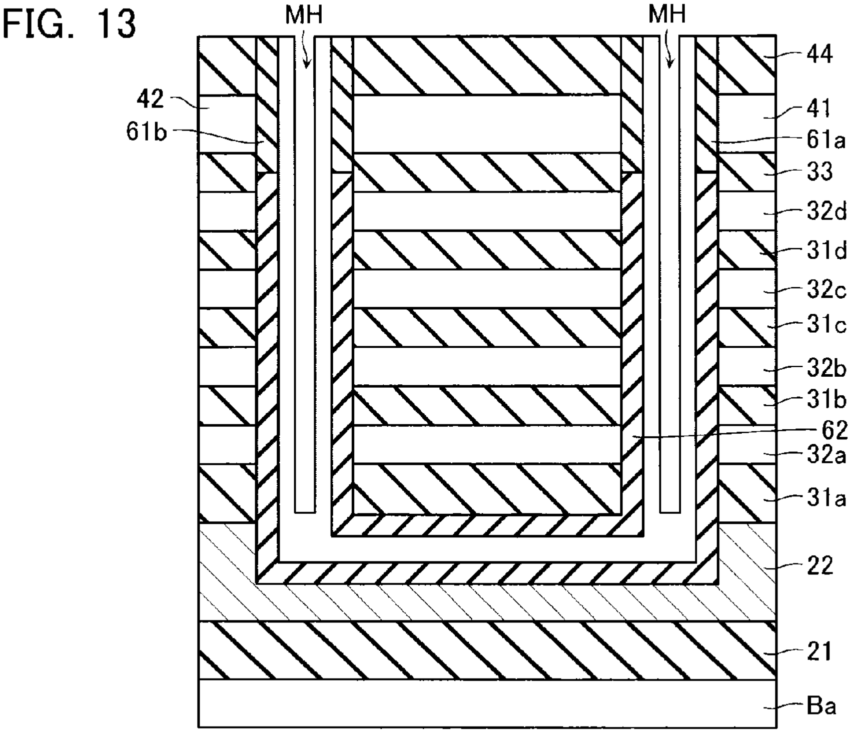
FIG. 13 illustrates a manufacturing process of the memory transistor region according to the first embodiment.

Then, with reference to FIG. 13, amorphous silicon (a-Si) is deposited to fill in the back gate hole 24, the memory hole MH, and the drain-side and source-side holes 45*b* and 45*a*. Usually, the channel semiconductor layer is formed by using the low-pressure CVD method or the like to deposit amorphous silicon inside the back gate hole 24 and the memory hole MH. After the low-pressure CVD method, a thermal process is carried out to change amorphous silicon into crystallized polysilicon. In this embodiment, carbon (C) is doped into amorphous silicon at a predetermined ratio before deposition.

In this embodiment, it is preferable to use, when the CVD method is carried out to deposit amorphous silicon for the U-shaped semiconductor layer 63, a mixed gas of a monosilane gas ($SiH_4$) and a monomethylsilane gas ($CH_3SiH_3$) as a process gas. Alternately, a mixed gas of an acetylene gas ($C_2H_2$), a dichlorosilane gas ($SiH_2Cl_2$), and a hydrogen gas ($H_2$) may be used. After the amorphous silicon layer is formed, a crystallization thermal treatment is carried out. For example, under the condition of $N_2$, 530° C. to 570° C., and 1 to 24 hours, crystallization annealing is carried out. By this step, the carbon-doped U-shaped semiconductor layer 63 may be formed.

Figure 14:
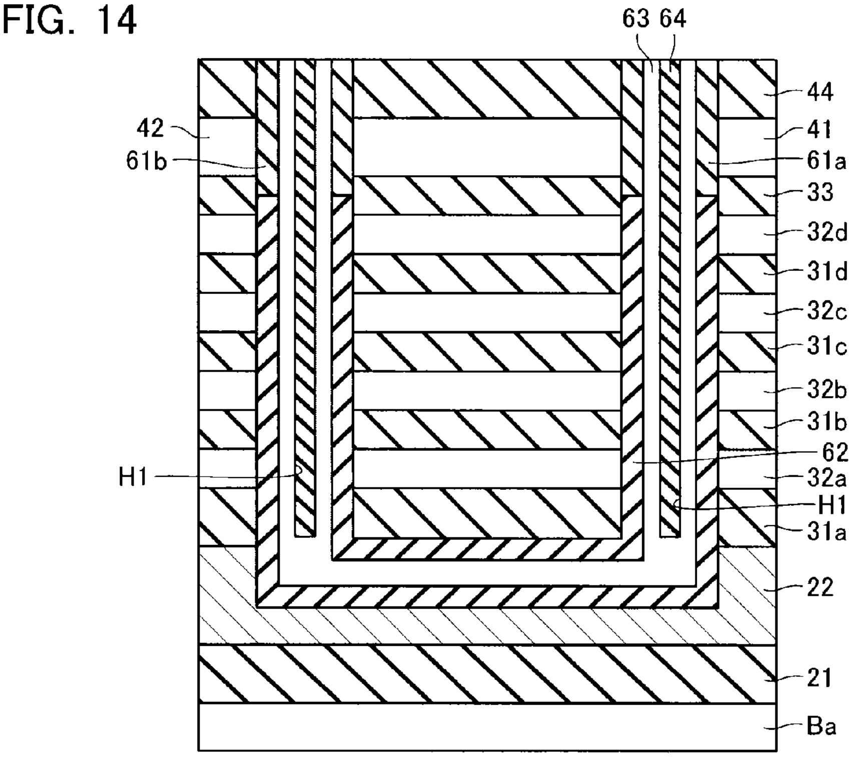
FIG. 14 illustrates a manufacturing process of the memory transistor region according to the first embodiment.

Then, with reference to FIG. 14, in the hole portion of the U-shaped semiconductor layer 63, the inner insulating layer 64 is formed. Then, a known step is used to form predetermined wiring lines or the like, thus forming the non-volatile semiconductor memory device 100 shown in FIG. 1 to FIG. 5A.

Second Embodiment

Figure 15:
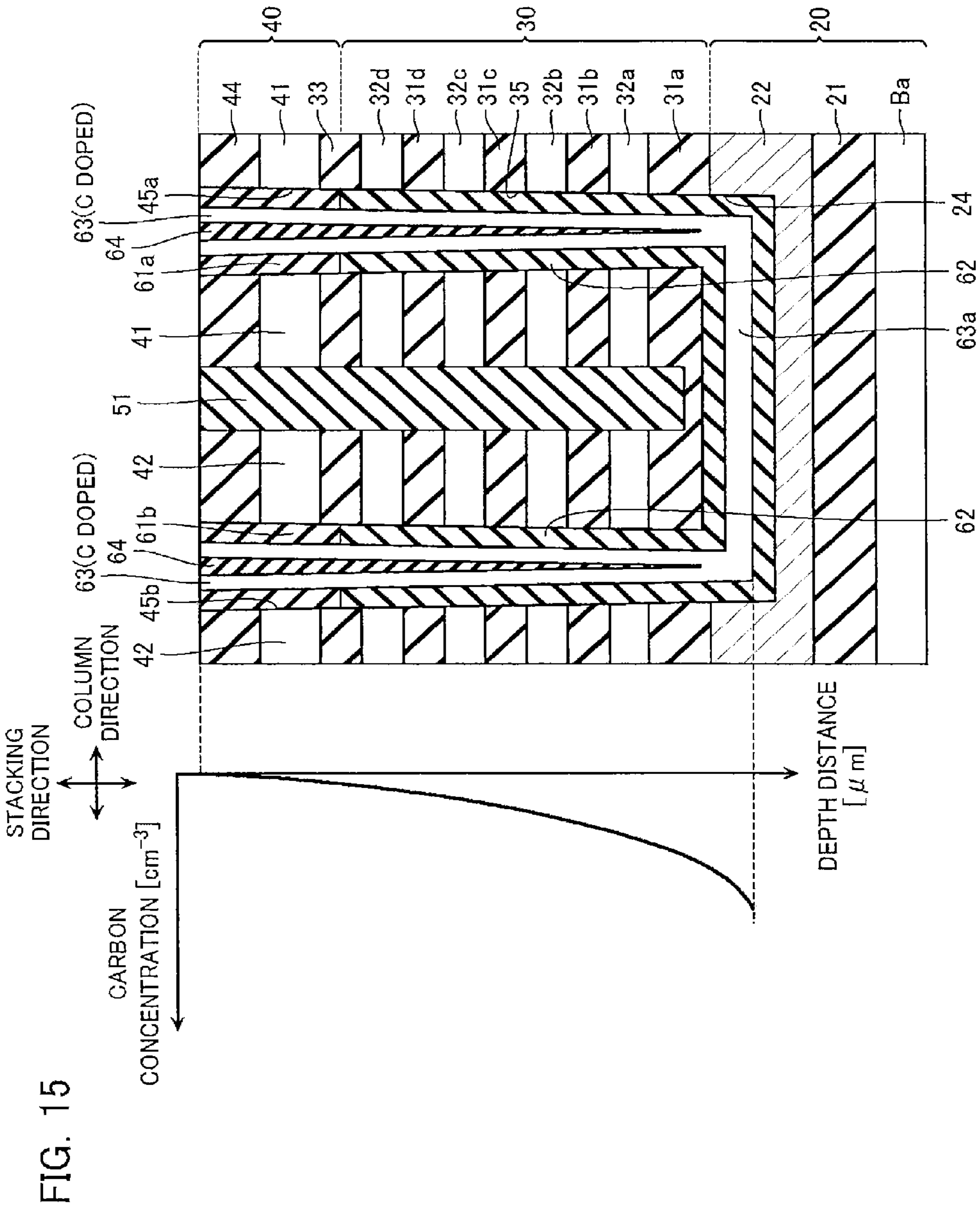
FIG. 15 is a cross-sectional view of a memory transistor region according to a second embodiment.

Then, with reference to FIG. 15, a second embodiment will be described. The entire configuration of the non-volatile semiconductor memory device according to the second embodiment is similar to that in the first embodiment, and thus its detailed description is omitted here. In addition, like elements as those in the first embodiment are designated by like reference numerals, and repeated description thereof is omitted here. The non-volatile semiconductor memory device according to this embodiment is different from that according to the first embodiment in that an inclination is formed so that the diameters of the memory hole 35 in the memory transistor layer 30 and the drain-side and source-side holes 45*b* and 45*a* in the select transistor layer 40 are larger in the upper layers and smaller in the lower layers. In addition, the non-volatile semiconductor memory device according to this embodiment is different from that according to the first embodiment in that the carbon concentration in the U-shaped semiconductor layer 63 changes in the depth direction. With reference to FIG. 15, the non-volatile semiconductor memory device according to this embodiment will be described below.

(Specific Configuration of Non-Volatile Semiconductor Memory Device 100 According to Second Embodiment)

FIG. 15 is a cross-sectional view of the memory transistor region 12 in the non-volatile semiconductor memory device 100 according to the second embodiment. In addition, FIG. 15 shows a cross-section in the column direction.

To highly integrate the non-volatile semiconductor memory device 100, increasing the number of stacked layers such as the word-line conductive layer 32 will increase the difficulty of processing by the RIE. Therefore, a taper shape is likely to occur in which the memory hole 35 in the memory transistor layer 30 and the drain-side and source-side holes 45*b* and 45*a* in the select transistor layer 40 have a diameter larger in the upper layers and smaller in the lower layers. This embodiment comprises a taper shape in which the diameters of the memory hole 35 and the drain-side and source-side holes 45 and 45*a* are larger in the upper layers and smaller in the lower layers. As a result, the U-shaped semiconductor layer 63 and the memory gate insulating layer 62 are formed to decrease in diameter along the stacking direction from the upper side to the lower side.

In addition, in this embodiment, the U-shaped semiconductor layer 63 is formed to have a constant film thickness in the areas of the memory transistor layer 30 and the select transistor layer 40. As a result, the inner insulating layer 64 as the core material is formed to have a diameter decreasing from the top of the drain-side and source-side holes 45*b* and 45*a* toward the bottom of the memory hole 35.

In addition, the U-shaped semiconductor layer 63 is configured to have a carbon (C) concentration gradient in the stacking direction in which the carbon (C) concentration is lower in the higher layers and increases toward the lower layers. In this embodiment, the portions of the U-shaped semiconductor layer 63 that provide the channels of the drain-side select transistor SDTr and the source-side select transistor SSTr comprise polysilicon or lightly carbon (C) doped silicon.

[Effects]

The non-volatile semiconductor memory device according to this embodiment has a taper shape in which the diameters of the memory hole 35 and the drain-side and source-side holes 45 and 45*a* are larger in the upper layers and smaller in the lower layers. Therefore, the U-shaped semiconductor layer 63 that provides the channels has a diameter smaller in the memory transistors MTr configured in the position of the bottom layer word-line conductive layer 32*a* than in the memory transistors MTr configured in the position of the upper-layer word-line conductive layer 32*d*. In this case, the memory transistors MTr configured in the position of the word-line conductive layer 32*a* may experience a higher electric field from the word-line conductive layer 32*a* than the upper-layer memory transistors MTr do. As a result, the properties may be different between the memory transistors MTr configured in the position of the lower-layer word-line conductive layer 32*a* and the memory transistors MTr configured in the position of the upper-layer word-line conductive layer 32*d*.

In contrast, in the non-volatile semiconductor memory device according to this embodiment, the U-shaped semiconductor layer 63 is configured to have a carbon (C) concentration gradient in the stacking direction in which the carbon (C) concentration is higher in the lower layers and decreases toward the upper layers. The memory transistors MTr configured in the position of the lower-layer word-line conductive layer 32*a* comprise more carbon doped silicon. Therefore, compared to the memory transistors MTr configured in the position of the upper-layer word-line conductive layer 32*d*, the lower edge Ec of the conduction band rises and the upper edge Ev of the valence band falls. As a result, in the lower layers of the U-shaped semiconductor layer 63, the channel electron density is decreased in the U-shaped semiconductor layer 63 that functions as the channels of the memory transistors MTr. Decrease of the channel electron density in the U-shaped semiconductor layer 63 increases the threshold voltage of the memory transistors MTr. Therefore, even for voltage application during the read operation, the effect of the voltage may be reduced, thus stably holding data of the memory transistors MTr. In the non-volatile semiconductor memory device according to this embodiment, the U-shaped semiconductor layer 63 has a concentration gradient of carbon (C) in the stacking direction. This may reduce the property variation between the upper and lower layer memory transistors MTr.

[Manufacturing Method]

A method of manufacturing the non-volatile semiconductor memory device according to this embodiment will be described. FIG. 16 to FIG. 20 illustrate manufacturing processes of the memory transistor region according to this embodiment. The method of manufacturing the non-volatile semiconductor memory device according to this embodiment is similar to the manufacturing method in the first embodiment until the step of stacking the first to fourth inter-word-line insulating layers 31*a* to 31*d*, the first to fourth word-line conductive layers 32*a* to 32*d*, the memory protection insulating layer 33, the source-side conductive layer 41, the drain-side conductive layer 42, and the select transistor insulating layer 44 as shown in FIG. 9.

Figure 16:
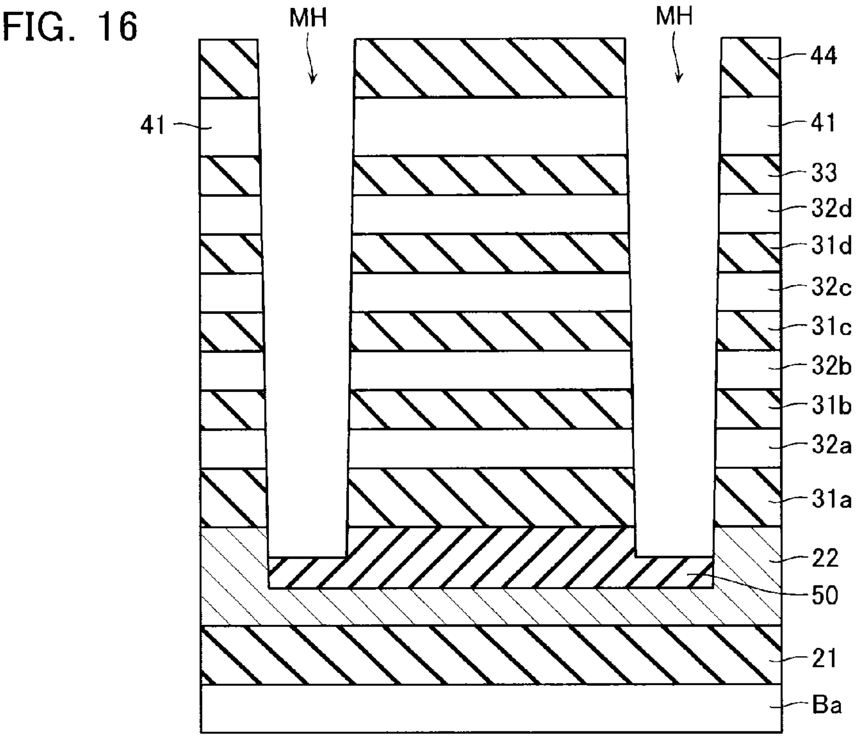
FIG. 16 illustrates a manufacturing process of the memory transistor region according to the second embodiment.

With reference to FIG. 16, a memory hole MH is formed passing through the select transistor insulating layer 44, the source-side conductive layer 41, the drain-side conductive layer 42, the memory protection insulating layer 33, the first to fourth inter-word-line insulating layer 31*a* to 31*e*, and the first to fourth word-line conductive layers 32*a* to 32*d*. The memory hole MH is formed to arrive at the upper surfaces at the column direction ends of the sacrificing layer 50. To highly integrate the non-volatile semiconductor memory device 100, increasing the number of stacked layers such as the word-line conductive layer 32 will increase the difficulty of processing by the RIE. Therefore, a taper shape may be formed in which the memory hole MH has a diameter larger in the upper layers and smaller in the lower layers.

Figure 17:
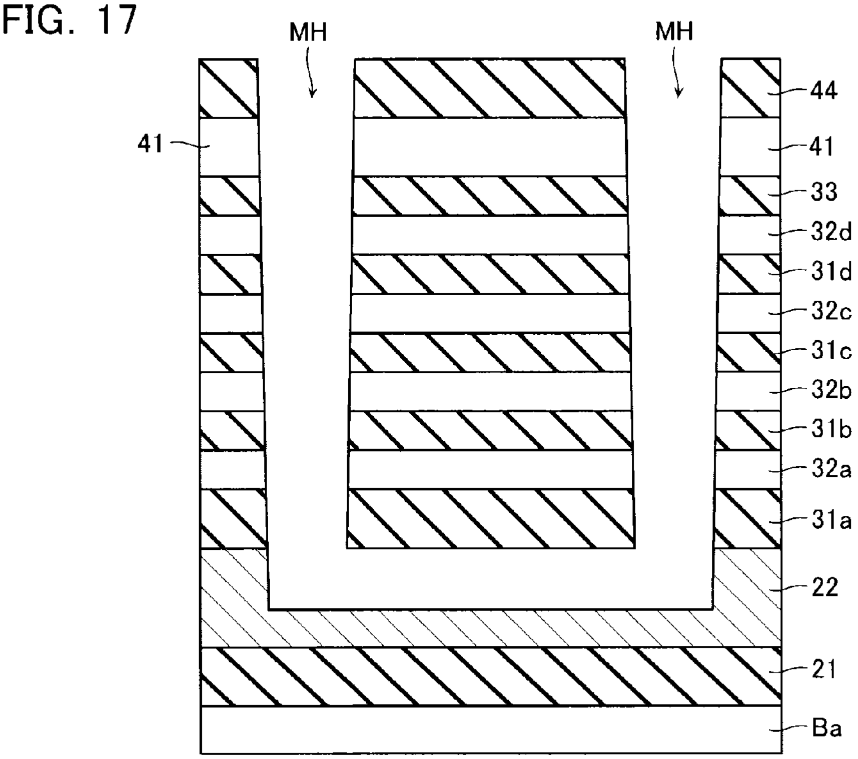
FIG. 17 illustrates a manufacturing process of the memory transistor region according to the second embodiment.

Then, with reference to FIG. 17, a hot phosphoric acid solution is used to remove the sacrificing layer 50.

Figure 18:
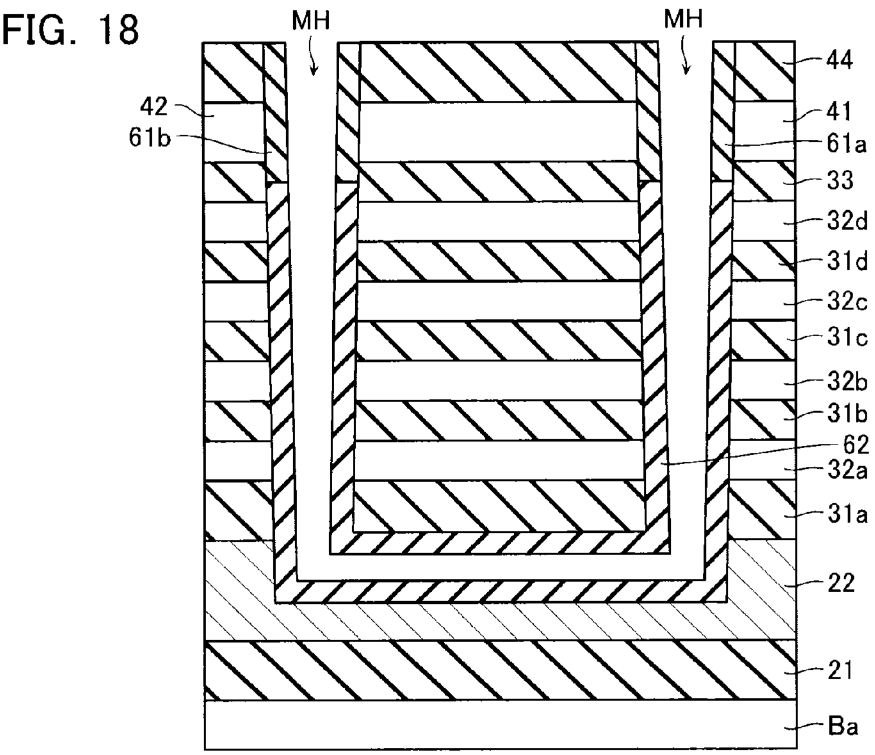
FIG. 18 illustrates a manufacturing process of the memory transistor region according to the second embodiment.

Then, with reference to FIG. 18, silicon dioxide ($SiO_2$), silicon nitride (SiN), and silicon dioxide ($SiO_2$) are deposited. By this step, the memory gate insulating layer 62 is formed. In addition, after this step, silicon dioxide ($SiO_2$) and silicon nitride (SiN) formed on the side surfaces of the source-side conductive layer 41 and the drain-side conductive layer 42 are removed to form the drain-side gate insulating layer 61*b* and the source-side gate insulating layer 61*a*.

Figure 19:
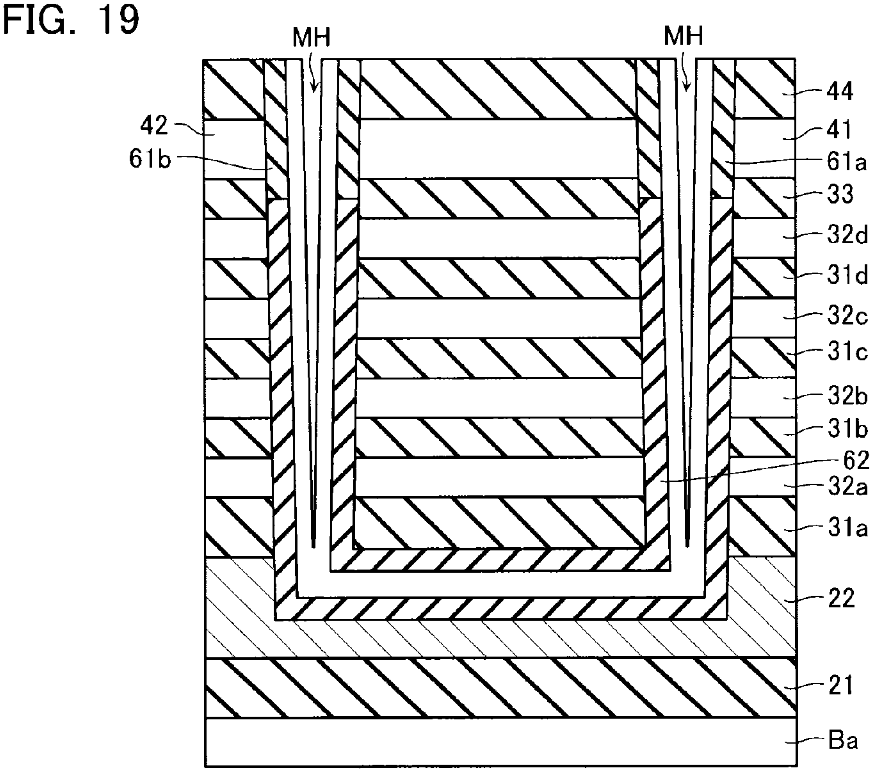
FIG. 19 illustrates a manufacturing process of the memory transistor region according to the second embodiment.

Then, with reference to FIG. 19, amorphous silicon (a-Si) is deposited to fill in the back gate hole 24, the memory hole MH, and the drain-side and source-side holes 45*a* and 45*b*. Usually, the channel semiconductor layer is formed using the low-pressure CVD method or the like to deposit amorphous silicon inside the back gate hole 24 and the memory hole MH. After the low-pressure CVD method, a thermal process is carried out to change amorphous silicon into crystallized polysilicon. In this embodiment, carbon (C) is doped in amorphous silicon before deposition so that carbon (C) contained in amorphous silicon changes in a predetermined ratio. In so doing, amorphous silicon is deposited with a hollow left inside.

In this embodiment, it is preferable to use, when the CVD method is carried out to deposit amorphous silicon for the U-shaped semiconductor layer 63, a mixed gas of a monosilane gas ($SiH_4$) and a monomethylsilane gas ($CH_3SiH_3$) as a process gas, and gradually decreasing the ratio of the monomethylsilane gas. Alternatively, a process may be used that uses a mixed gas of an acetylene gas ($C_2H_2$), a dichlorosilane gas ($SiH_2Cl_2$), and a hydrogen gas ($H_2$) and gradually decreases the ratio of the acetylene gas. By changing the gas flow rate ratio, a structure may be formed in which the carbon (C) concentration has a concentration gradient in which the carbon (C) concentration is higher in the lower layer portion of the U-shaped semiconductor layer 63 and gradually decreases toward the upper layers. After the amorphous silicon layer is formed, a crystallization thermal treatment is carried out. For example, under the condition of $N_2$, 530° C. to 570° C., and 1 to 24 hours, a crystallization annealing is carried out. By this step, the carbon-doped U-shaped semiconductor layer 63 may be formed. Note that the U-shaped semiconductor layer 63 is formed to have the same film thickness in the upper and lower layers.

Figure 20:
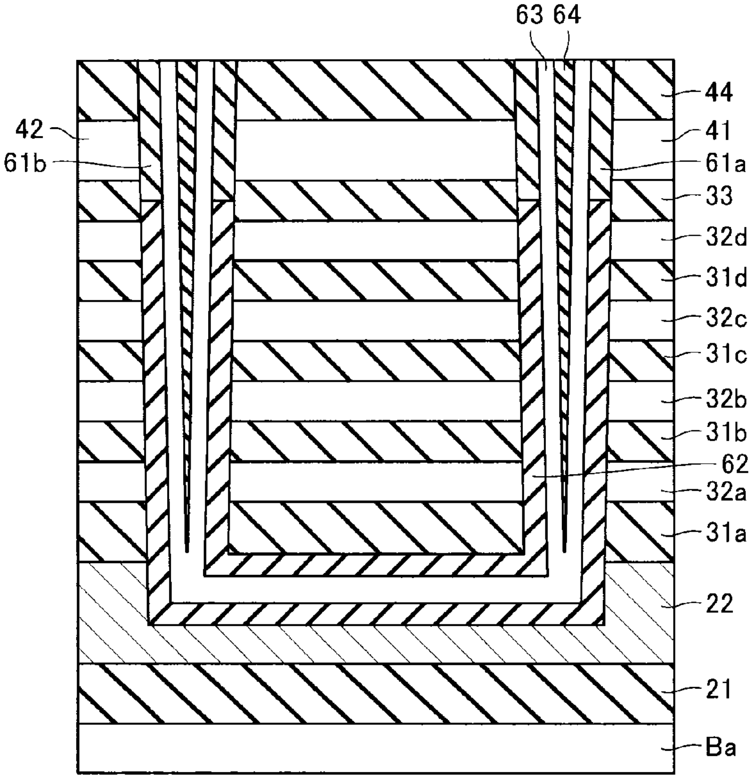
FIG. 20 illustrates a manufacturing process of the memory transistor region according to the second embodiment.

Then, with reference to FIG. 20, in the hole portion of the U-shaped semiconductor layer 63, the inner insulating layer 64 is formed. Then, a known step is used to form predetermined wiring lines or the like, thus forming the non-volatile semiconductor memory device 100 shown in FIG. 15.

Third Embodiment

Figure 21:
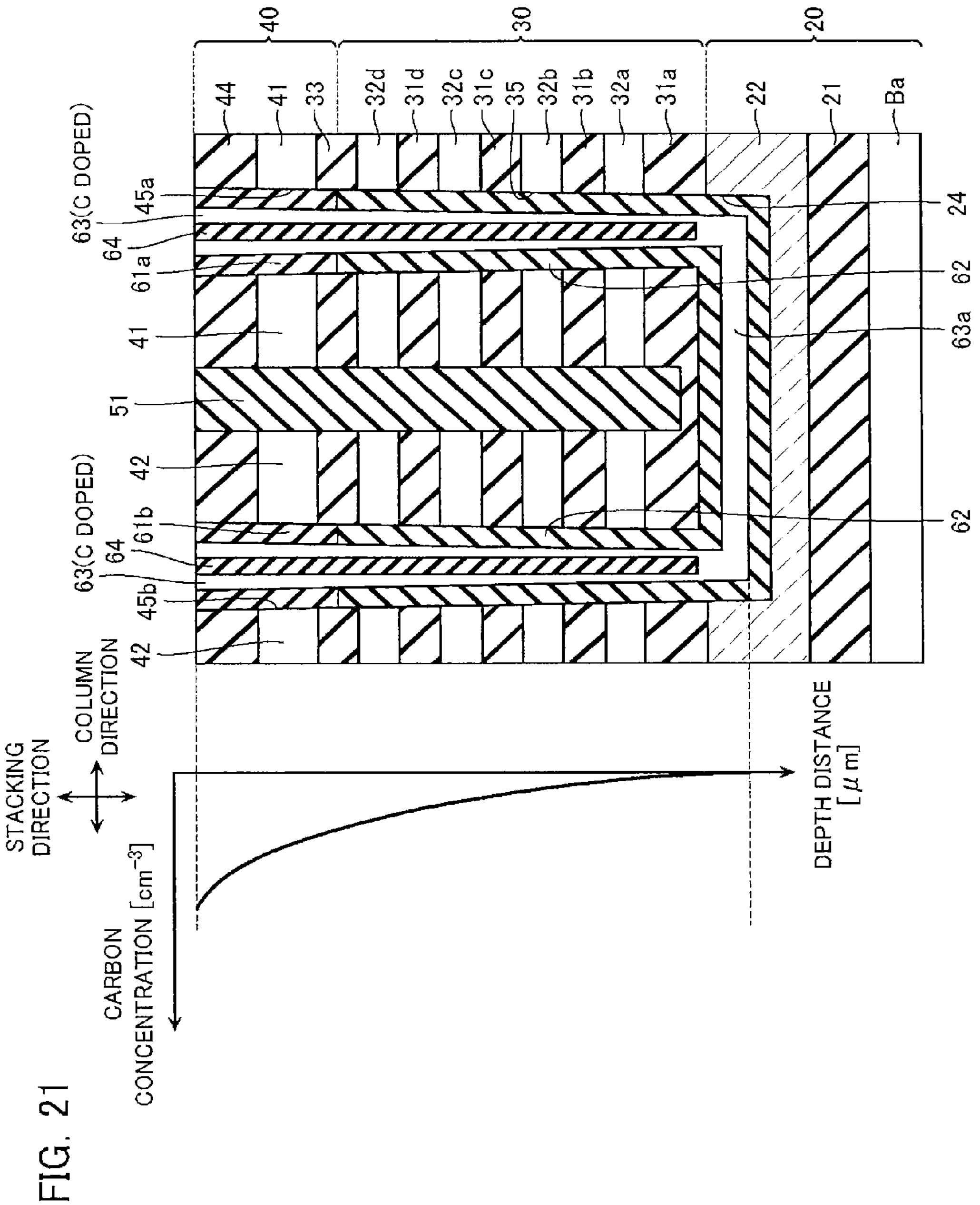
FIG. 21 is a cross-sectional view of a memory transistor region according to a third embodiment.

Then, with reference to FIG. 21, a third embodiment will be described. The entire configuration of the non-volatile semiconductor memory device according to the third embodiment is similar to that in the first embodiment, and thus its detailed description is omitted here. In addition, like elements as those in the first embodiment are designated by like reference numerals, and repeated description thereof is omitted here. The non-volatile semiconductor memory device according to this embodiment is different from that according to the second embodiment in that the U-shaped semiconductor layer 63 is formed to have a film thickness larger in the upper layers and smaller in the lower layers. In addition, in the non-volatile semiconductor memory device according to this embodiment, the carbon concentration change in the U-shaped semiconductor layer 63 is different from that in the second embodiment. With reference to FIG. 21, the non-volatile semiconductor memory device according to this embodiment will be described below.

(Specific Configuration of Non-Volatile Semiconductor Memory Device 100 According to Third Embodiment)

FIG. 21 is a cross-sectional view of the memory transistor region 12 in the non-volatile semiconductor memory device 100 according to the third embodiment. In addition, FIG. 21 shows a cross-section in the column direction.

The non-volatile semiconductor memory device according to this embodiment also has a taper shape in which the diameters of the memory hole 35 and the drain-side and source-side holes 45 and 45*a* are larger in the upper layers and smaller in the lower layers. As a result, the U-shaped semiconductor layer 63 and the memory gate insulating layer 62 are formed so that their diameters decrease from the upper to lower layers in the stacking direction.

In addition, in this embodiment, the inner insulating layer 64 as the core material is formed to have a constant diameter from the top of the drain-side and source-side holes 45*b* and 45*a* toward the bottom of the memory hole 35. As a result, the U-shaped semiconductor layer 63 is formed so that in the regions of the memory transistor layer 30 and the select transistor layer 40, the film thickness is larger in the upper layers and decreases toward the lower layers.

In addition, the U-shaped semiconductor layer 63 is configured to have a carbon (C) concentration gradient in the stacking direction in which the carbon (C) concentration is lower in the lower layers and increases toward the upper layers. In this embodiment, the portion of the U-shaped semiconductor layer 63 that provides the channels of the drain-side select transistor SDTr and the source-side select transistor SSTr comprises polysilicon or highly carbon (C) doped silicon. Including but not limited to this, the portion of the U-shaped semiconductor layer 63 that provides the channels of the drain-side select transistor SDTr and the source-side select transistor SSTr may comprise non-doped polysilicon or lightly carbon (C) doped silicon in which the carbon (C) concentration is discontinuous with the carbon (C) concentration in the memory transistor layer 30.

[Effects]

The non-volatile semiconductor memory device according to this embodiment has a taper shape in which the diameters of the memory hole 35 and the drain-side and source-side holes 45 and 45*a* are larger in the upper layers and smaller in the lower layers. In addition, the U-shaped semiconductor layer 63 is formed to have, in the regions of the memory transistor layer 30 and the select transistor layer 40, a thickness larger in the upper layers and smaller in the lower layers. In the above second embodiment, the memory hole 35 and the drain-side and source-side holes 45 and 45*a* have a taper shape, and thus the memory transistors MTr in the lower layers are likely to have data variation. To respond to this property change, in the second embodiment, carbon is doped to increase the carbon concentration in the lower layers of the U-shaped semiconductor layer 63.

However, as described in this embodiment, if the film thickness of the U-shaped semiconductor layer 63 is larger in the upper layers and smaller in the lower layers, the upper-layer memory transistors MTr are more likely to have electrons generated therein and have a potential difference. In this case, the upper-layer memory transistors MTr are more likely to have data variation during the read operation. If the non-volatile semiconductor memory device becomes finer, the effect of the data variation of the upper-layer memory transistors MTr due to the film thickness of the U-shaped semiconductor layer 63 may exceed the effect of the data variation of the lower-layer memory transistors MTr due to the taper shape. As a result, the properties may be different between the memory transistors MTr configured in the position of the lower-layer word-line conductive layer 32*a* and the memory transistors MTr configured in the position of the upper-layer word-line conductive layer 32*d*.

In contrast, in the non-volatile semiconductor memory device according to this embodiment, the U-shaped semiconductor layer 63 is configured to have a carbon (C) concentration gradient in the stacking direction in which the carbon (C) concentration is lower in the lower layers and increases toward the upper layers. The memory transistors MTr configured in the position of the upper-layer word-line conductive layer 32*a* comprises more carbon doped silicon. Therefore, compared to the memory transistors MTr configured in the position of the lower-layer word-line conductive layer 32*d*, the lower edge Ec of the conduction band rises and the upper edge Ev of the valence band falls. As a result, in the upper layer portion of the U-shaped semiconductor layer 63, the channel electron density is decreased in the U-shaped semiconductor layer 63 that functions as the channels of the memory transistors MTr. Decrease of the channel electron density in the U-shaped semiconductor layer 63 increases the threshold voltage of the memory transistors MTr. Therefore, even for voltage application during the read operation, the effect of the voltage may be reduced, thus stably holding data of the memory transistors MTr. In the non-volatile semiconductor memory device according to this embodiment, the U-shaped semiconductor layer 63 has a concentration gradient of carbon (C) in the stacking direction. This may reduce the property variation between the upper and lower layer memory transistors MTr.

[Manufacturing Method]

Figure 22:
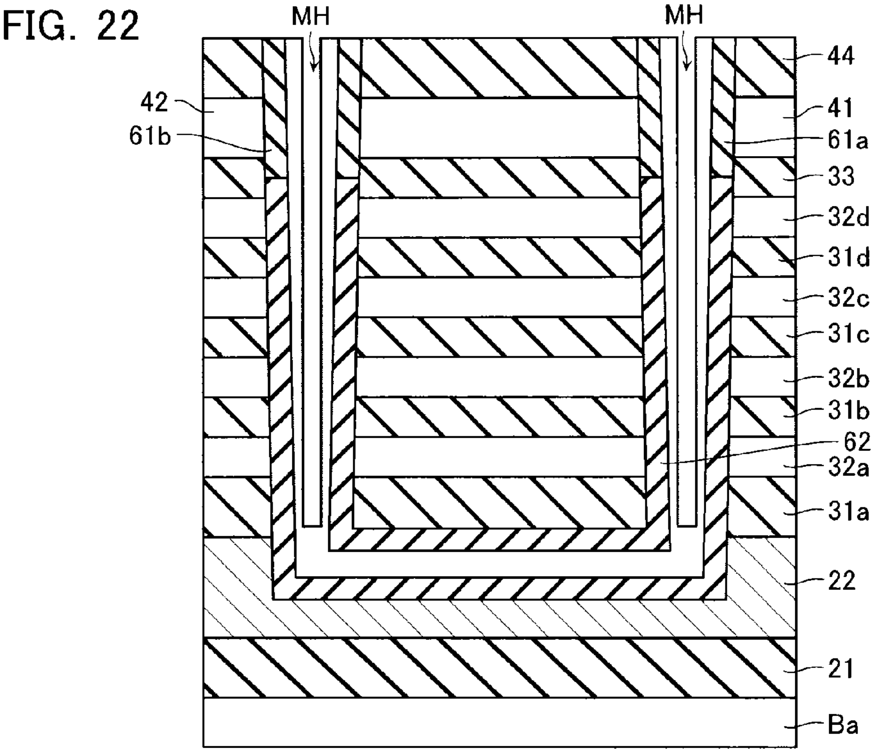
FIG. 22 illustrates a manufacturing process of the memory transistor region according to the third embodiment.
Figure 23:
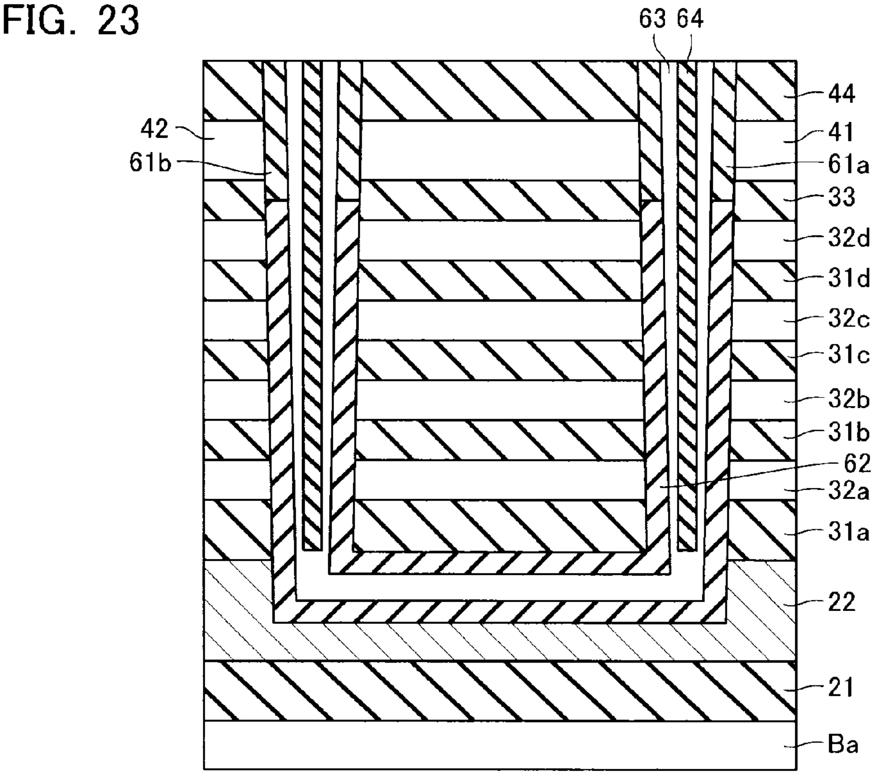
FIG. 23 illustrates a manufacturing process of the memory transistor region according to the third embodiment.

A method of manufacturing the non-volatile semiconductor memory device according to this embodiment will be described. FIG. 22 to FIG. 23 illustrate manufacturing processes of the memory transistor region according to this embodiment. A method of manufacturing the non-volatile semiconductor memory device according to this embodiment is similar to the manufacturing method in the second embodiment until the step of forming the memory gate insulating layer 62, the drain-side gate insulating layer 61*b*, and the source-side gate insulating layer 61*a* as shown in FIG. 18.

With reference to FIG. 22, amorphous silicon (a-Si) is deposited to fill in the back gate hole 24, the memory hole MH, and the drain-side and source-side holes 45*a* and 45*b*. Usually, the channel semiconductor layer is formed by using the low-pressure CVD method or the like to deposit amorphous silicon inside the back gate hole 24 and the memory hole MH. After the low-pressure CVD method, a thermal process is carried out to change amorphous silicon into crystallized polysilicon. In this embodiment, carbon (C) is doped in amorphous silicon before deposition so that carbon (C) contained in amorphous silicon changes in a predetermined ratio. In so doing, amorphous silicon is deposited with a hollow left inside.

In this embodiment, it is preferable that, when depositing amorphous silicon for the U-shaped semiconductor layer 63, the CVD method is carried out by using a mixed gas of a monosilane gas ($SiH_4$) and a monomethylsilane gas ($CH_3SiH_3$) as a process gas, and gradually increasing the ratio of the monomethylsilane gas. Alternatively, a process may be used that uses a mixed gas of an acetylene gas ($C_2H_2$), a dichlorosilane gas ($SiH_2Cl_2$), and a hydrogen gas ($H_2$), and gradually increases the ratio of the acetylene gas. By changing the gas flow rate ratio, a structure may be formed in which the carbon (C) concentration has a concentration gradient in which the carbon (C) concentration is higher in the higher layer portion of the U-shaped semiconductor layer 63 and gradually decreases toward the lower layers. After the amorphous silicon layer is formed, a crystallization thermal treatment is carried out. For example, under the condition of $N_2$, 530° C. to 570° C., and 1 to 24 hours, a crystallization annealing is carried out. By this step, the carbon-doped U-shaped semiconductor layer 63 may be formed. Note that after the U-shaped semiconductor layer 63 is deposited once, the U-shaped semiconductor layer 63 is etched to leave a memory hole MH inside the U-shaped semiconductor layer 63, the memory hole MH having a uniform width. As a result, the U-shaped semiconductor layer 63 is formed to have a film thickness larger in the upper layers and smaller in the lower layers.

Then, with reference to FIG. 23, in the hole portion of the U-shaped semiconductor layer 63, the inner insulating layer 64 is formed. Then, a known step is used to form predetermined wiring lines or the like, thus forming the non-volatile semiconductor memory device 100 shown in FIG. 21.

Fourth Embodiment

Figure 24:
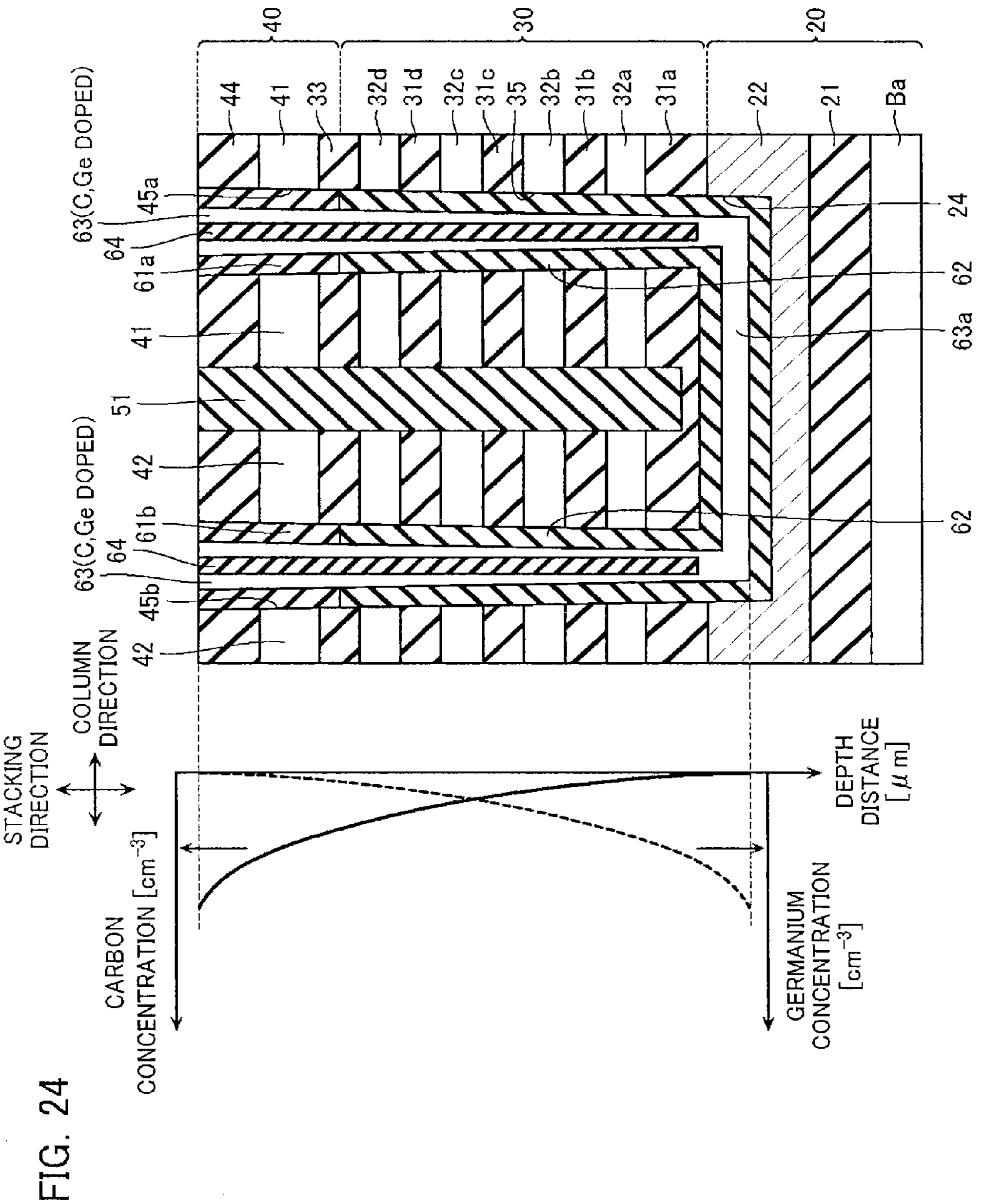
FIG. 24 is a cross-sectional view of a memory transistor region according to a fourth embodiment.

Then, with reference to FIG. 24, a fourth embodiment will be described. The entire configuration of the non-volatile semiconductor memory device according to the fourth embodiment is similar to that in the first embodiment, and thus its detailed description is omitted here. In addition, like elements as those in the first embodiment are designated by like reference numerals, and repeated description thereof is omitted here. The non-volatile semiconductor memory device according to this embodiment is different from that according to the third embodiment in that the U-shaped semiconductor layer 63 is doped with carbon (C) as well as germanium (Ge). With reference to FIG. 24, the non-volatile semiconductor memory device according to this embodiment will be described below.

(Specific Configuration of Non-Volatile Semiconductor Memory Device 100 According to Fourth Embodiment)

FIG. 24 is a cross-sectional view of the memory transistor region 12 in the non-volatile semiconductor memory device 100 according to the fourth embodiment. In addition, FIG. 24 shows a cross-section in the column direction.

The non-volatile semiconductor memory device according to this embodiment also has a taper shape in that the diameters of the memory hole 35 and the drain-side and source-side holes 45 and 45*a* are larger in the upper layers and smaller in the lower layers.

In addition, in this embodiment, the inner insulating layer 64 as the core material is formed to have a constant thickness from the top of the drain-side and source-side holes 45*b* and 45*a* toward the bottom of the memory hole 35. As a result, the U-shaped semiconductor layer 63 is formed so that in the regions of the memory transistor layer 30 and the select transistor layer 40, the film thickness is larger in the upper layers and decreases toward the lower layers.

The U-shaped semiconductor layer 63 is configured to have a carbon (C) concentration gradient in the stacking direction in which the carbon (C) concentration is lower in the lower layers and increases toward the upper layers. In addition, in this embodiment, the U-shaped semiconductor layer 63 is configured to have a germanium (Ge) concentration gradient in the stacking direction in which the germanium (Ge) concentration is higher in the lower layers and decreases toward the upper layers. Preferably, the germanium (Ge) concentration in the U-shaped semiconductor layer 63 is about 1 to 30%, but it is not limited thereto. The appropriate germanium concentration may be set according to the degree of desired band-gap size (the conduction band rise) or the like. Excessive germanium (Ge) doping may increase the leak current when the memory transistor MTr is off. Therefore, preferably the germanium (Ge) concentration is about 1 to 30% in the U-shaped semiconductor layer 63.

The portion of the U-shaped semiconductor layer 63 that provides the channels of the drain-side select transistor SDTr and the source-side select transistor SSTr comprises polysilicon or highly carbon (C) doped silicon. Including but not limited to this, the portion of the U-shaped semiconductor layer 63 that provides the channels of the drain-side select transistor SDTr and the source-side select transistor SSTr may comprise non-doped polysilicon or lightly carbon (C) doped silicon in which the carbon (C) concentration is discontinuous with the carbon (C) concentration in the memory transistor layer 30.

[Effects]

The non-volatile semiconductor memory device according to this embodiment has a taper shape in which the diameters of the memory hole 35 and the drain-side and source-side holes 45 and 45*a* are larger in the upper layers and smaller in the lower layers. In addition, the U-shaped semiconductor layer 63 is formed to have, in the regions of the memory transistor layer 30 and the select transistor layer 40, a thickness larger in the upper layers and smaller in the lower layers. As described in the third embodiment, if the effect of the data variation of the upper-layer memory transistors MTr due to the film thickness of the U-shaped semiconductor layer 63 exceeds the effect of the lower-layer data variation of the memory transistors MTr due to the taper shape, the upper-layer memory transistors MTr are more likely to have data variation during the read operation. As a result, the properties may be different between the memory transistors MTr configured in the position of the lower-layer word-line conductive layer 32*a* and the memory transistors MTr configured in the position of the upper-layer word-line conductive layer 32*d*.

Figure 25A:
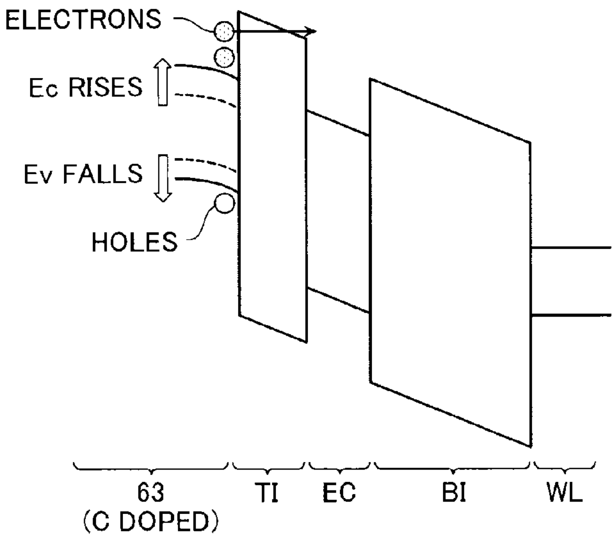
FIG. 25A illustrates a band gap of the memory transistor according to the fourth embodiment.
Figure 25B:
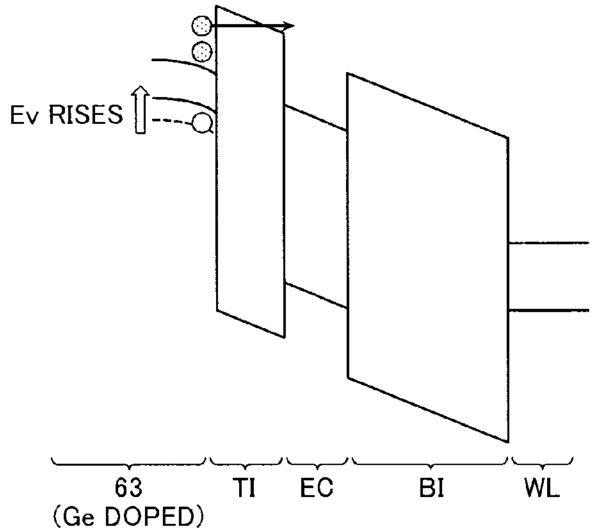
FIG. 25B illustrates a band gap of the memory transistor according to the fourth embodiment.

FIG. 25A and FIG. 25B are band gap diagrams of the U-shaped semiconductor layer 63 according to this embodiment. With reference to FIG. 25A, the U-shaped semiconductor layer according to this embodiment comprises carbon-doped silicon, which raises the lower edge Ec of the conduction band. In the non-volatile semiconductor memory device according to this embodiment, the U-shaped semiconductor layer 63 is configured to have a carbon (C) concentration gradient in the stacking direction in which the carbon (C) concentration is lower in the lower layers and increases toward the upper layers. The memory transistors MTr configured in the position of the upper-layer word-line conductive layer 32*a* comprise more carbon doped silicon. Therefore, compared to the memory transistors MTr configured in the position of the lower-layer word-line conductive layer 32*d*, the lower edge Ec of the conduction band rises. As a result, in the upper layer portion of the U-shaped semiconductor layer 63, the channel electron density is decreased in the U-shaped semiconductor layer 63 that functions as the channels of the memory transistors MTr. Decrease of the channel electron density in the U-shaped semiconductor layer 63 increases the threshold voltage of the memory transistors MTr. Therefore, even for voltage application during the read operation, the effect of the voltage may be reduced, thus stably holding data of the memory transistors MTr.

In addition, the U-shaped semiconductor layer 63 according to this embodiment comprises germanium doped silicon in the lower layers. With reference to FIG. 25B, in the germanium doped region, the upper edge Ev of the valence band rises and the lower edge Ec of the conduction band is not very different from that in silicon. In this case, the electron tunneling probability is considered to be similar to that of non-doped silicon. In the germanium (Ge)-doped U-shaped semiconductor layer 63, the threshold voltage may be decreased in a memory transistors MTr in the lower layer region with a small diameter. This may decrease the voltages to be applied in the write/read operations. The operation voltage decrease may reduce the degradation of the cell performance.

In the non-volatile semiconductor memory device according to this embodiment, the U-shaped semiconductor layer 63 has a concentration gradient of carbon (C) and germanium (Ge) in the stacking direction. This may reduce the property variation between the upper and lower layer memory transistors MTr and prevent the property degradation of the memory transistors MTr.

[Manufacturing Method]

Figure 26:
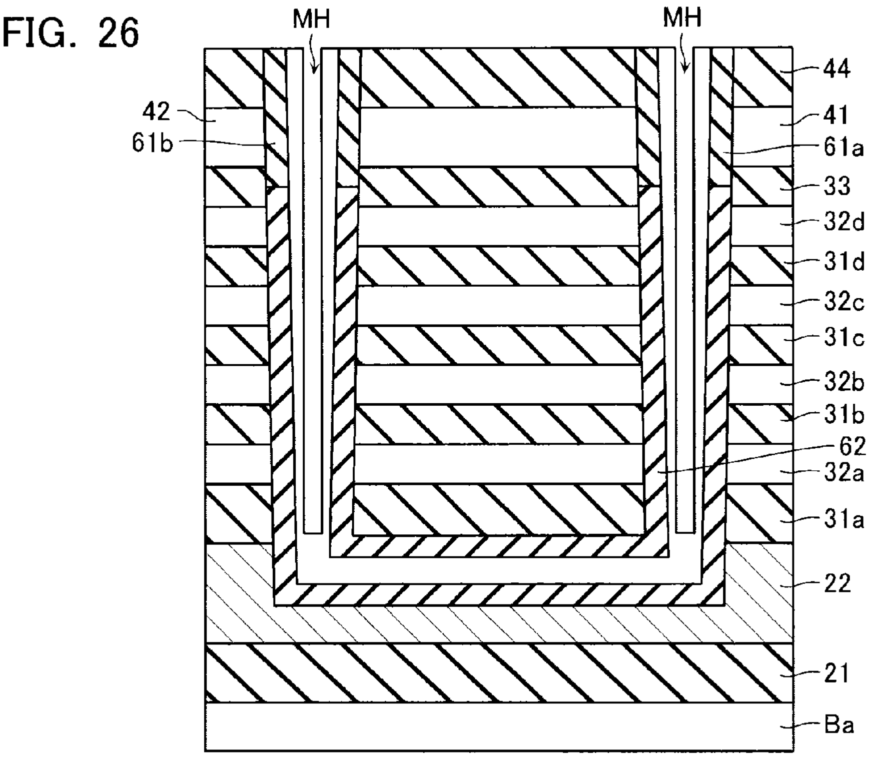
FIG. 26 illustrates a manufacturing process of the memory transistor region according to the fourth embodiment.
Figure 27:
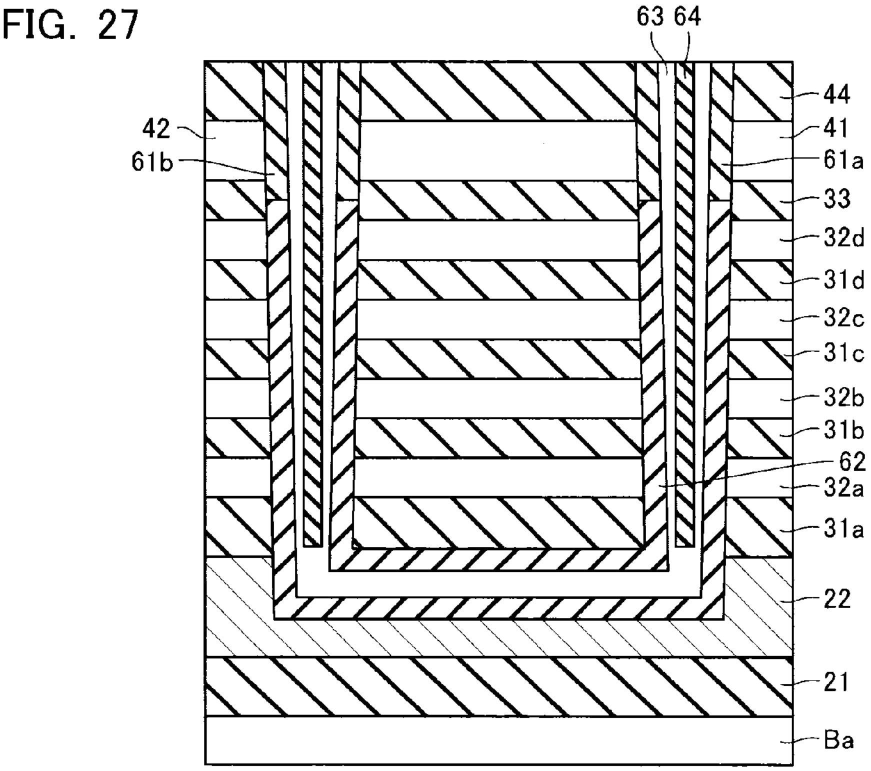
FIG. 27 illustrates a manufacturing process of the memory transistor region according to the fourth embodiment.

A method of manufacturing the non-volatile semiconductor memory device according to this embodiment will be described. FIG. 26 to FIG. 27 illustrate manufacturing processes of the memory transistor region according to this embodiment. A method of manufacturing the non-volatile semiconductor memory device according to this embodiment is similar to the manufacturing method in the second embodiment until the step of forming the memory gate insulating layer 62, the drain-side gate insulating layer 61*b*, and the source-side gate insulating layer 61*a* as shown in FIG. 18.

With reference to FIG. 26, amorphous silicon (a-Si) is deposited to fill in the back gate hole 24, the memory hole MH, and the drain-side and source-side holes 45*a* and 45*b*. Usually, the channel semiconductor layer is formed by using the low-pressure CVD method or the like to deposit amorphous silicon inside the back gate hole 24 and the memory hole MH. After the low-pressure CVD method, a thermal process is carried out to change amorphous silicon into crystallized polysilicon. In this embodiment, carbon (C) and germanium (Ge) are doped in amorphous silicon before deposition so that carbon (C) and germanium (Ge) contained in amorphous silicon change in a predetermined ratio. Here, amorphous silicon is deposited with a hollow left inside.

In this embodiment, when depositing amorphous silicon for the U-shaped semiconductor layer 63, the CVD method is carried out by using a mixed gas of the monosilane gas ($SiH_4$), the germanium hydride gas ($GeH_4$), and the hydrogen gas ($H_2$) and decreasing the ratio of the germanium hydride gas. In addition, it is preferable to use a mixed gas of a monosilane gas ($SiH_4$) and a monomethylsilane gas ($CH_3SiH_3$) as a process gas and gradually increase the ratio of the monomethylsilane gas. Carbon may be doped by a process that uses a mixed gas of an acetylene gas ($C_2H_2$), a dichlorosilane gas ($SiH_2Cl_2$), and a hydrogen gas ($H_2$), and gradually increases the acetylene gas ratio. By changing the gas flow rate ratio, a structure may be formed in which the carbon (C) concentration has a concentration gradient in which the carbon (C) concentration is higher in the upper layer portion of the U-shaped semiconductor layer 63 and gradually decreases toward the lower layers. In addition, by changing the gas flow rate ratio, a structure may formed in which the germanium (Ge) concentration has a concentration gradient in which the germanium (Ge) concentration is higher in the lower layer portion of the U-shaped semiconductor layer 63 and gradually decreases toward the upper layers. After the amorphous silicon layer is formed, a crystallization thermal treatment is carried out. For example, under the condition of $N_2$, 530° C. to 570° C., and 1 to 24 hours, a crystallization annealing is carried out. By this step, the carbon-doped U-shaped semiconductor layer 63 may be formed. Note that after the U-shaped semiconductor layer 63 is deposited once, the U-shaped semiconductor layer 63 is etched to leave a memory hole MH inside the U-shaped semiconductor layer 63, the memory hole MH having a uniform width. As a result, the U-shaped semiconductor layer 63 is formed to have a film thickness larger in the upper layers and smaller in the lower layers.

Then, with reference to FIG. 27, in the hole portion of the U-shaped semiconductor layer 63, the inner insulating layer 64 is formed. Then, a known step is used to form predetermined wiring lines or the like, thus forming the non-volatile semiconductor memory device 100 shown in FIG. 24.

Fifth Embodiment

Figure 28:
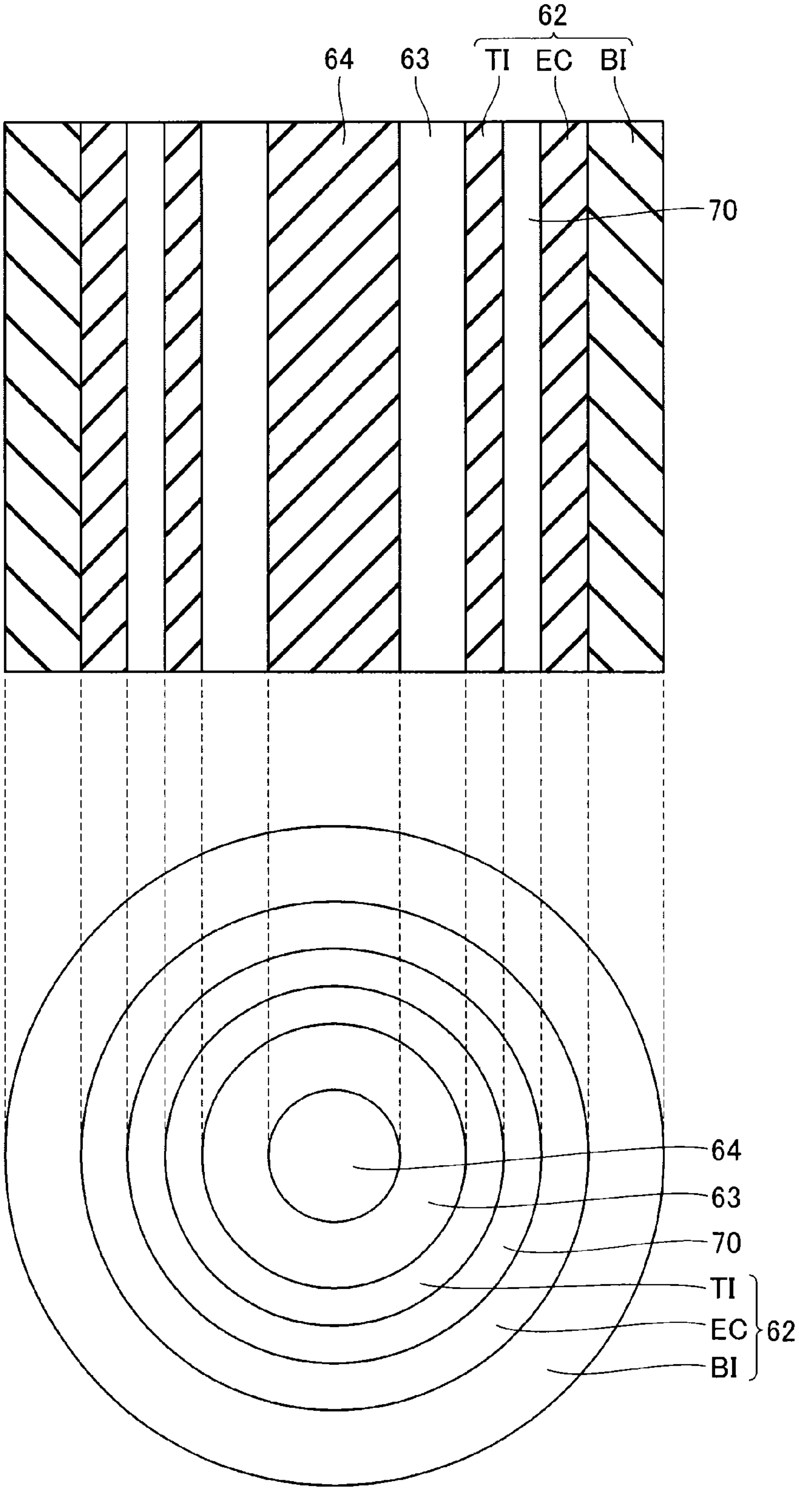
FIG. 28 is a cross-sectional view of a memory transistor region according to a fifth embodiment.

Then, with reference to FIG. 28, a fifth embodiment will be described. The entire configuration of the non-volatile semiconductor memory device according to the fifth embodiment is similar to that in the first embodiment, and thus its detailed description is omitted here. In addition, like elements as those in the first embodiment are designated by like reference numerals, and repeated description thereof is omitted here. The non-volatile semiconductor memory device according to this embodiment is different from those according to the above embodiments in that an alumina ($Al_2O_3$) film 70 is provided between the charge accumulation layer EC and the tunnel insulating layer TI in each memory transistor MTr. The configuration in this embodiment may be applied to any of the above embodiments. With reference to FIG. 28, the non-volatile semiconductor memory device according to this embodiment will be described below.

(Specific Configuration of Non-Volatile Semiconductor Memory Device 100 According to Fifth Embodiment)

FIG. 28 is a cross-sectional view of the memory transistor MTr according to this embodiment. FIG. 28 shows cross-sections in the column and stacking directions. The alumina ($Al_2O_3$) film 70 is provided between the charge accumulation layer EC and the tunnel insulating layer TI in the memory transistor MTr. The alumina ($Al_2O_3$) film 70 has a thickness of about 0.1 nm to 1 nm.

The charge accumulation layer EC and the tunnel insulating layer TI comprise the materials as described in the above embodiments. The layers EC and TI also comprise any material that may show an effect of reducing detrapping of electrons in the direction from the charge accumulation layer EC to the tunnel insulating layer TI when holding data. The reducing may be carried out by raising the band offset on the side of the tunnel insulating layer TI from the side of the charge accumulation layer EC when the alumina ($Al_2O_3$) film 70 is inserted between the charge accumulation layer EC and the tunnel insulating layer TI.

[Effects]

In the non-volatile semiconductor memory device according to this embodiment, the alumina ($Al_2O_3$) film 70 provided between the charge accumulation layer EC and the tunnel insulating layer TI may raise the band offset of the tunnel insulating layer TI by dipole. This may decrease the number of electrons detrapped in the direction of the tunnel insulating layer TI, and thus reduce the leak current under the low electric field application. This may improve the data hold characteristics of the memory transistor MTr.

Another Example in Fifth Embodiment

Figure 29:
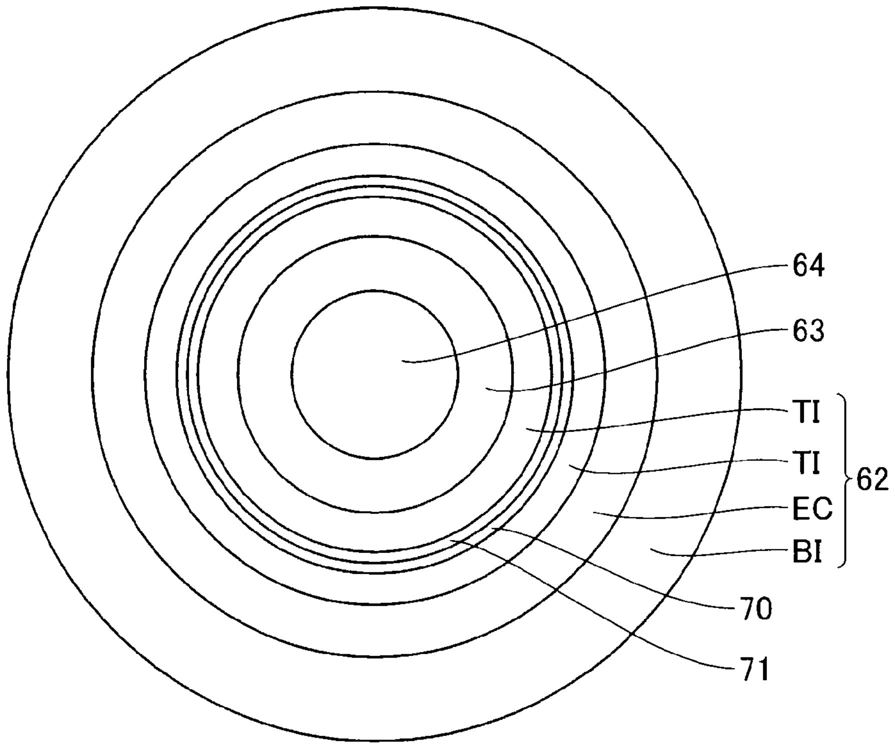
FIG. 29 is a cross-sectional view of the memory transistor region according to the fifth embodiment.

FIG. 29 is a cross-sectional view showing a memory transistor MTr according to another example in this embodiment. FIG. 29 show cross-sections in the column and stacking directions. Inside the tunnel insulating layer TI in the memory transistor MTr, the alumina ($Al_2O_3$) film 70 and the silicon nitride film 71 are provided. The alumina ($Al_2O_3$) film 70 has a thickness of about 0.1 nm to 1 nm.

The configuration of the tunnel insulating layer TI of this example shown in FIG. 29 comprises a stack structure of a silicon oxide film/an alumina ($Al_2O_3$) film 70/a silicon nitride film 71/a silicon oxide film. The configuration of the tunnel insulating layer TI may be a stack structure of a silicon oxide film/an alumina ($Al_2O_3$) film 70/a silicon oxide film, a stack structure of a silicon oxynitride film/an alumina ($Al_2O_3$) film 70/a silicon oxynitride film, or a stack structure of a silicon oxide film/an alumina ($Al_2O_3$) film 70/a silicon nitride film.

[Effects]

In the non-volatile semiconductor memory device of this example, the alumina ($Al_2O_3$) film 70 inside the tunnel insulating layer TI may raise the band offset of the tunnel insulating layer TI. This may reduce the number of electrons detrapped in the direction of the tunnel insulating layer TI, and thus reduce the leak current under the low electric field application. This may improve the data hold characteristics of the memory transistor MTr.

Some embodiments of the present invention have been described, but these embodiments are shown by way of example and are not intended to limit the scope of the invention. These new embodiments may be implemented in various other forms, and be subjected to various omissions, replacements, and modifications without departing from the spirit of the present invention. These embodiments and variants thereof are within the scope and sprit of the invention, and are also within the scope of the invention as defined in the appended claims and the equivalents thereof.

Although, for example, the U-shaped semiconductor layer 63 according to this embodiment has a U-shape in which the lower edges are connected, the semiconductor layer that provides the channels of the memory string is not limited to the U-shape. The above embodiments may also be applied to a semiconductor layer that provides the channels of the memory string formed in an I-shape perpendicular to the semiconductor substrate Ba.

What is claimed is:

1. A non-volatile semiconductor memory device comprising a memory string, the memory string including a plurality of electrically rewritable memory transistors connected in series, the memory string comprising:

a first semiconductor layer formed in a columnar shape extending in a stacking direction perpendicular to a substrate;

a first film formed surrounding a side surface of the first semiconductor layer;

a second film formed surrounding the first film and configured to be capable of accumulating charges;

a third film formed surrounding the second film;

a plurality of first conductive layers formed surrounding the third film and disposed at a predetermined interval in the stacking direction, the first semiconductor layer comprising carbon-doped silicon; and an alumina film provided between the first film and the second film.

2. A non-volatile semiconductor memory device comprising a memory string, the memory string including a plurality of electrically rewritable memory transistors connected in series, the memory string comprising:

a first semiconductor layer formed in a columnar shape extending in a stacking direction perpendicular to a substrate;

a first film formed surrounding a side surface of the first semiconductor layer;

a second film formed surrounding the first film and configured to be capable of accumulating charges;

a third film formed surrounding the second film;

a plurality of first conductive layers formed surrounding the third film and disposed at a predetermined interval in the stacking direction, the first semiconductor layer comprising carbon-doped silicon; and an alumina film provided inside the first film.

3. A non-volatile semiconductor memory device comprising a memory string, the memory string including a plurality of electrically rewritable memory transistors connected in series, the memory string comprising:

a first semiconductor layer formed in a columnar shape extending in a stacking direction perpendicular to a substrate;

a first film formed surrounding a side surface of the first semiconductor layer;

a second film formed surrounding the first film and configured to be capable of accumulating charges;

a third film formed surrounding the second film;

a plurality of first conductive layers formed surrounding the third film and disposed at a predetermined interval in the stacking direction, the first semiconductor layer comprising carbon-doped silicon, wherein the first semiconductor layer is formed to decrease in diameter along the stacking direction from an upper side to a lower side, and the first semiconductor layer has generally the same film thickness along the stacking direction from an upper side to a lower side and is formed to increase in carbon concentration along the stacking direction from an upper side to a lower side.

4. The memory device according to claim 3, further comprising an alumina film provided between the first film and the second film.

5. The memory device according to claim 3, further comprising an alumina film provided inside the first film.

6. The memory device according to claim 3, wherein the first semiconductor layer includes therein an inner insulating layer, the inner insulating layer is formed to decrease in diameter from an upper side to a lower side.

7. A non-volatile semiconductor memory device comprising a memory string, the memory string including a plurality of electrically rewritable memory transistors connected in series, the memory string comprising:

a first semiconductor layer formed in a columnar shape extending in a stacking direction perpendicular to a substrate;

a first film formed surrounding a side surface of the first semiconductor layer;

a second film formed surrounding the first film and configured to be capable of accumulating charges;

a third film formed surrounding the second film; and a plurality of first conductive layers formed surrounding the third film and disposed at a predetermined interval in the stacking direction, the first semiconductor layer comprising carbon-doped silicon, wherein the first semiconductor layer is formed to decrease in diameter along the stacking direction from an upper side to a lower side, and the first semiconductor layer is formed to decrease in film thickness along the stacking direction from an upper side to a lower side and decrease in carbon concentration along the stacking direction from an upper side to a lower side.

8. The memory device according to claim 7, further comprising an alumina film provided between the first film and the second film.

9. The memory device according to claim 7, further comprising an alumina film provided inside the first film.

10. The memory device according to claim 7, wherein the first semiconductor layer includes therein an inner insulating layer, and the inner insulating layer is formed to have a constant diameter from top to bottom.

11. The memory device according to claim 7, wherein the first semiconductor layer comprises carbon and germanium doped silicon, and the first semiconductor layer is formed to increase in germanium concentration along the stacking direction from an upper side to a lower side.

12. The memory device according to claim 11, further comprising an alumina film provided between the first film and the second film.

13. The memory device according to claim 11, further comprising an alumina film provided inside the first film.

* * * * *